(12) United States Patent
Danno et al.

(10) Patent No.: US 10,643,930 B2
(45) Date of Patent: May 5, 2020

(54) SEMICONDUCTOR DEVICE WITH SEMICONDUCTOR CHIPS OF DIFFERENT SIZES AND MANUFACTURING METHOD THREREOF

(71) Applicant: Renesas Electronics Corporation, Tokyo (JP)

(72) Inventors: Tadatoshi Danno, Gunma (JP); Atsushi Nishikizawa, Gunma (JP); Hiroyuki Nakamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 74 days.

(21) Appl. No.: 15/826,815

(22) Filed: Nov. 30, 2017

(65) Prior Publication Data
US 2018/0182692 A1 Jun. 28, 2018

(30) Foreign Application Priority Data

Dec. 28, 2016 (JP) .................................. 2016-256057

(51) Int. Cl.
*H01L 23/495* (2006.01)
*H01L 23/00* (2006.01)
(Continued)

(52) U.S. Cl.
CPC .... *H01L 23/49503* (2013.01); *H01L 21/4825* (2013.01); *H01L 21/4828* (2013.01);
(Continued)

(58) Field of Classification Search
CPC ........... H01L 23/49575; H01L 23/4952; H01L 23/49531; H01L 23/49503; H01L 23/495;
(Continued)

(56) References Cited

U.S. PATENT DOCUMENTS 7,190,055 B2 3/2007 Inui et al.
2002/0146864 A1* 10/2002 Miyaki ............. H01L 23/49503
438/123

(Continued)

FOREIGN PATENT DOCUMENTS

EP 3002784 A1 4/2016
JP 11340272 A 12/1999
(Continued)

OTHER PUBLICATIONS

Okada, English Machine Translated of JP Publication 2015043398, May 3, 2015; (Machine translated Aug. 2, 2018).*
Communication dated May 24, 2018, from the European Patent Office in counterpart European Application No. 17203617.0.
European Office Action issued in corresponding European Patent Application No. 17203617.0-1211, dated Feb. 26, 2019.

*Primary Examiner* — Mohsen Ahmadi
(74) *Attorney, Agent, or Firm* — McDermott Will & Emery LLP

(57) ABSTRACT

An improvement is achieved in the reliability of a semiconductor device. A SIP includes an analog chip, a microcomputer chip having a main surface smaller in area than a main surface of the analog chip, a die pad over which the analog chip and the microcomputer chip are mounted, and a plurality of leads arranged so as to surround the die pad. The SIP further includes a plurality of suspension leads formed integrally with the die pad, a plurality of wires electrically coupling electrodes of the analog chip to the leads and electrically coupling the microcomputer chip to the leads, and a sealing body sealing therein the analog chip and the microcomputer chip. Each of first and second curved portions of the die pad has a radius of curvature larger than a radius of curvature of a third curved portion of the die pad.

8 Claims, 36 Drawing Sheets

(51) Int. Cl.
*H01L 21/56* (2006.01)
*H01L 21/48* (2006.01)
*H01L 23/31* (2006.01)
*H02P 27/06* (2006.01)

(52) U.S. Cl.
CPC ........ H01L 21/4842 (2013.01); H01L 21/565 (2013.01); H01L 23/3114 (2013.01); H01L 23/4952 (2013.01); H01L 23/49551 (2013.01); H01L 23/49568 (2013.01); H01L 23/49575 (2013.01); H01L 23/49582 (2013.01); H01L 23/562 (2013.01); *H01L 23/495* (2013.01); *H01L 23/49531* (2013.01); *H01L 2224/05554* (2013.01); *H01L 2224/48137* (2013.01); *H01L 2224/48247* (2013.01); *H01L 2224/49171* (2013.01); *H01L 2224/73265* (2013.01); *H01L 2924/181* (2013.01); *H02P 27/06* (2013.01)

(58) Field of Classification Search
CPC . H01L 2224/48247; H01L 2224/48137; H01L 2224/73265
See application file for complete search history.

(56) References Cited

U.S. PATENT DOCUMENTS

| | | | |
|---|---|---|---|
| 2005/0040512 | A1 | 2/2005 | Tsubonoya et al. |
| 2006/0220190 | A1* | 10/2006 | Inui ................... H01L 23/49575 257/666 |
| 2012/0238056 | A1* | 9/2012 | Numazaki ............. H01L 21/565 438/107 |
| 2014/0084434 | A1* | 3/2014 | Imura ............... H01L 23/49503 257/676 |
| 2014/0332942 | A1* | 11/2014 | Kanemoto ........ H01L 23/49541 257/676 |
| 2017/0077069 | A1* | 3/2017 | Danno ................. H01L 23/047 |
| 2017/0256509 | A1* | 9/2017 | Lee ..................... H01L 21/6836 |
| 2017/0309550 | A1* | 10/2017 | Danno ............... H01L 21/4828 |

FOREIGN PATENT DOCUMENTS

| | | |
|---|---|---|
| JP | 2006-313876 A | 11/2006 |
| JP | 2008135606 A | 8/2008 |
| JP | 2015-043398 A | 3/2015 |

* cited by examiner

SEMICONDUCTOR DEVICE WITH SEMICONDUCTOR CHIPS OF DIFFERENT SIZES AND MANUFACTURING METHOD THEREOF

CROSS-REFERENCE TO RELATED APPLICATIONS

The disclosure of Japanese Patent Application No. 2016-256057 filed on Dec. 28, 2016 including the specification, drawings and abstract is incorporated herein by reference in its entirety.

BACKGROUND

The present invention relates to a semiconductor device in which a plurality of semiconductor chips are mounted in juxtaposition over a die pad and a manufacturing technique therefor.

Each of the following documents discloses, as a semiconductor device, a structure in which a plurality of semiconductor chips are mounted in juxtaposition over a die pad.

Japanese Unexamined Patent Application Publication No. 2006-313876 (Patent Document 1) discloses a structure of a semiconductor device in which semiconductor chips of different sizes are mounted over a die pad which is disposed out of alignment with the center line of the main surface of a sealed/molded region.

On the other hand, Japanese Unexamined Patent Application Publication No. 2015-43398 (Patent Document 2) discloses a structure in which two semiconductor chips are provided over a die pad. Over one of the semiconductor chips, a single-layer interposer is further mounted such that the two semiconductor chips are electrically coupled to each other via the single-layer interposer.

RELATED ART DOCUMENTS

Patent Documents

[Patent Document 1] Japanese Unexamined Patent Application Publication No. 2006-313876
[Patent Document 2] Japanese Unexamined Patent Application Publication No. 2015-43398

SUMMARY

A semiconductor device is known in which semiconductor chips of different sizes are mounted in juxtaposition over a die pad (chip mounting portion), such as a SIP (System In Package).

In a structure in which large and small two sized semiconductor chips are mounted over a die pad having a quadrilateral shape in plan view, with regard to the smaller semiconductor chip (hereinafter referred to also as the small chip), wires between the small chip and inner leads are elongated so that wire sweep is likely to occur in a resin molding step.

In view of this, the present inventors have conducted study on a structure in which a die pad having a protruding two-dimensional shape is used, a small chip is mounted over the portion of the protruding die pad which has a smaller area, and inner leads electrically coupled to the small chip are disposed closer to the die pad to reduce the lengths of the wires between the small chip and the inner leads. This can reduce wire sweep in a resin molding step. By reducing the lengths of the wires between the small chip and the inner leads, the material cost of a semiconductor device can be reduced.

However, in the structure using the protruding die pad described above, there is a suspension lead which cannot be connected to the outside corner portion of the die pad. The plurality of outside corner portions of the die pad include the outside corner portion which is unconnected to the suspension lead and is therefore exposed.

The present inventors have found that, on such an exposed outside corner portion of a die pad, a stress resulting from a temperature change (e.g., during a temperature cycle test after the manufacturing of a semiconductor device, during secondary mounting performed by a customer, or under a high/low temperature load after mounting) or the like is likely to be concentrated to cause delamination between the die pad and a resin and degrade the reliability of the semiconductor device.

Other problems and novel features of the present invention will become apparent from a statement in the present specification and the accompanying drawings.

A semiconductor device according to an embodiment has a first semiconductor chip, a second semiconductor chip, a chip mounting portion over which the foregoing first and second semiconductor chips are mounted, a plurality of leads, a plurality of suspension leads formed integrally with the foregoing chip mounting portion, and a sealing body. In plan view, the foregoing first semiconductor chip has a main surface larger in area than a main surface of the foregoing second semiconductor chip, a first side extending in a first direction, and a second side extending in a second direction. In plan view, the foregoing second semiconductor chip has a third side extending in the foregoing first direction and a fourth side extending in the foregoing second direction. In plan view, the foregoing chip mounting portion has a first curved portion continued to each of fifth and ninth sides of the foregoing chip mounting portion and a second curved portion continued to each of seventh and eighth sides of the foregoing chip mounting portion. In plan view, the foregoing chip mounting portion further includes a third curved portion continued to each of a tenth side of a second suspension lead and the foregoing fifth side of the foregoing chip mounting portion. Each of the foregoing first and second curved portions has a radius of curvature larger than a radius of curvature of the foregoing third curved portion.

A method of manufacturing a semiconductor device according to the embodiment includes the steps of: (a) providing a lead frame having a chip mounting portion, a plurality of leads, and a plurality of suspension leads formed integrally with the foregoing chip mounting portion; and (b) mounting, over the foregoing chip mounting portion, a first semiconductor chip and a second semiconductor chip having a main surface smaller in plane area than a main surface of the foregoing first semiconductor chip. The method of manufacturing the semiconductor device further includes the steps of: (c) electrically coupling any of a plurality of electrodes of the foregoing first semiconductor chip to any of the foregoing plurality of leads, any of a plurality of electrodes of the foregoing second semiconductor chip to any of the foregoing plurality of leads, and any of the plurality of electrodes of the foregoing first semiconductor chip to any of the plurality of electrodes of the foregoing second semiconductor chip via a plurality of respective conductive members; and (d) forming a sealing body. In the lead frame provided in the foregoing step (a), the foregoing chip mounting portion has a first portion and a second portion smaller in width than the first portion in plan view.

In plan view, an outside corner portion of the foregoing first portion which is defined by an eleventh side extending along a first direction and a twelfth side connected to the foregoing eleventh side and extending in a second direction crossing the foregoing first direction is assumed to be a first curved portion. In plan view, an outside corner portion of the foregoing second portion which is defined by a thirteenth side extending along the foregoing first direction and a fourteenth side connected to the foregoing thirteenth side and extending along the foregoing second direction is assumed to be a second curved portion. When an inside corner portion defined in plan view by a fifteenth side of the suspension lead connected to the outside corner portion of the foregoing first portion and the foregoing eleventh side of the foregoing first portion connected to the foregoing fifteenth side is assumed to be a third curved portion, each of the foregoing first and second curved portions has a radius of curvature larger than a radius of curvature of the foregoing third curved portion.

According to the foregoing embodiment, it is possible to improve the reliability of the semiconductor device.

DETAILED DESCRIPTION

Figure 1:
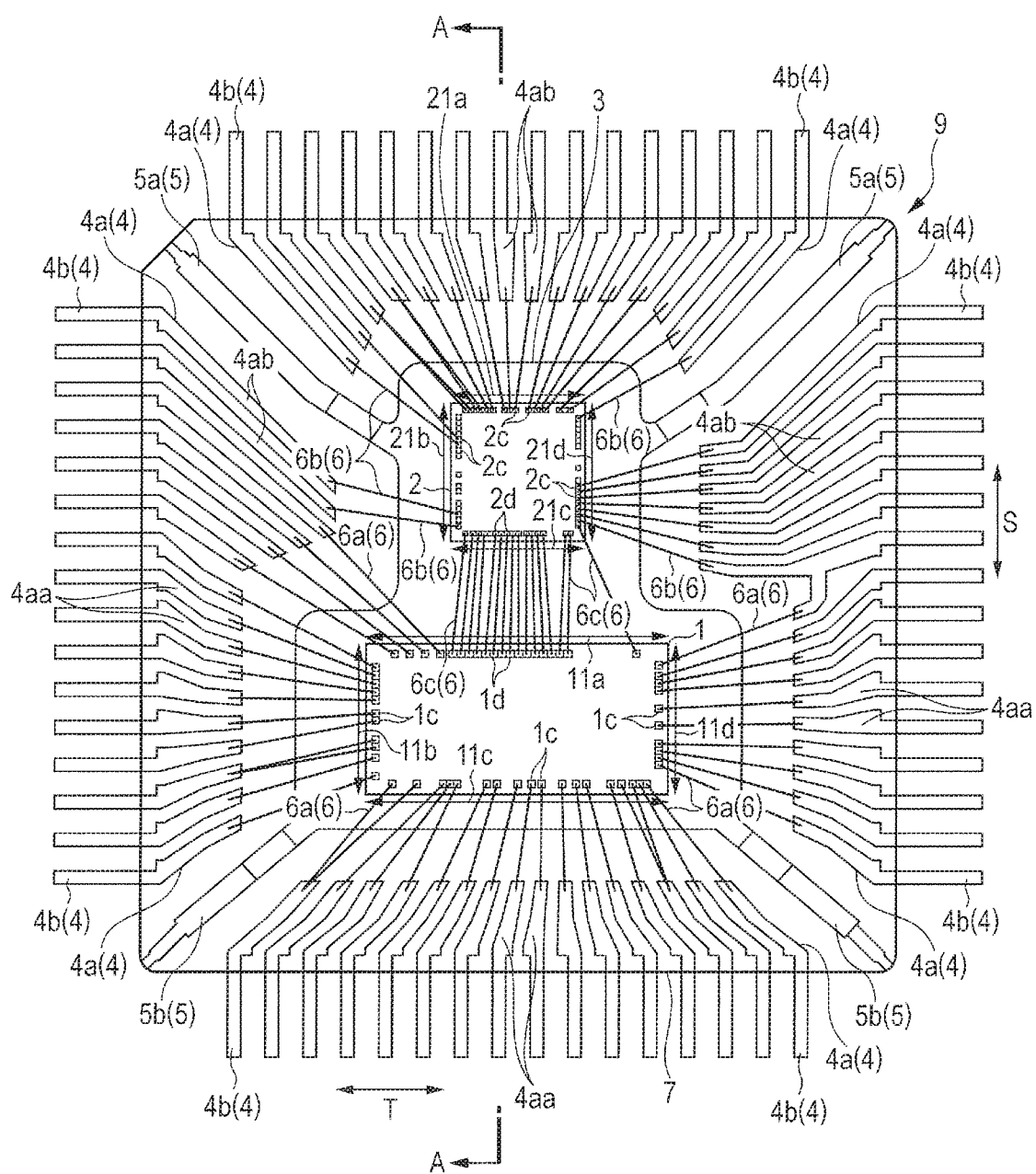
FIG. 1 is a plan view showing an example of a structure of a semiconductor device in an embodiment through the inner portion thereof.

In the following embodiment, a description of the same or like parts will not be repeated in principle unless particularly necessary.

Also, in the following embodiment, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others.

Also, in the following embodiment, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers.

Also, in the following embodiment, it goes without saying that the components thereof (including also elements, steps, and the like) are not necessarily indispensable unless particularly explicitly described otherwise or unless the components are considered to be obviously indispensable in principle.

Also, in the following embodiment, if the shapes, positional relationships, and the like of the components and the like are referred to in each of the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiment of the present invention in detail on the basis of the drawings. Note that, throughout all the drawings for illustrating the embodiment, members having the same functions are designated by the same reference numerals, and a repeated description thereof is omitted. For improved clarity of illustration, even a plan view may be hatched.

<Structure of Semiconductor Device>

Figure 2:
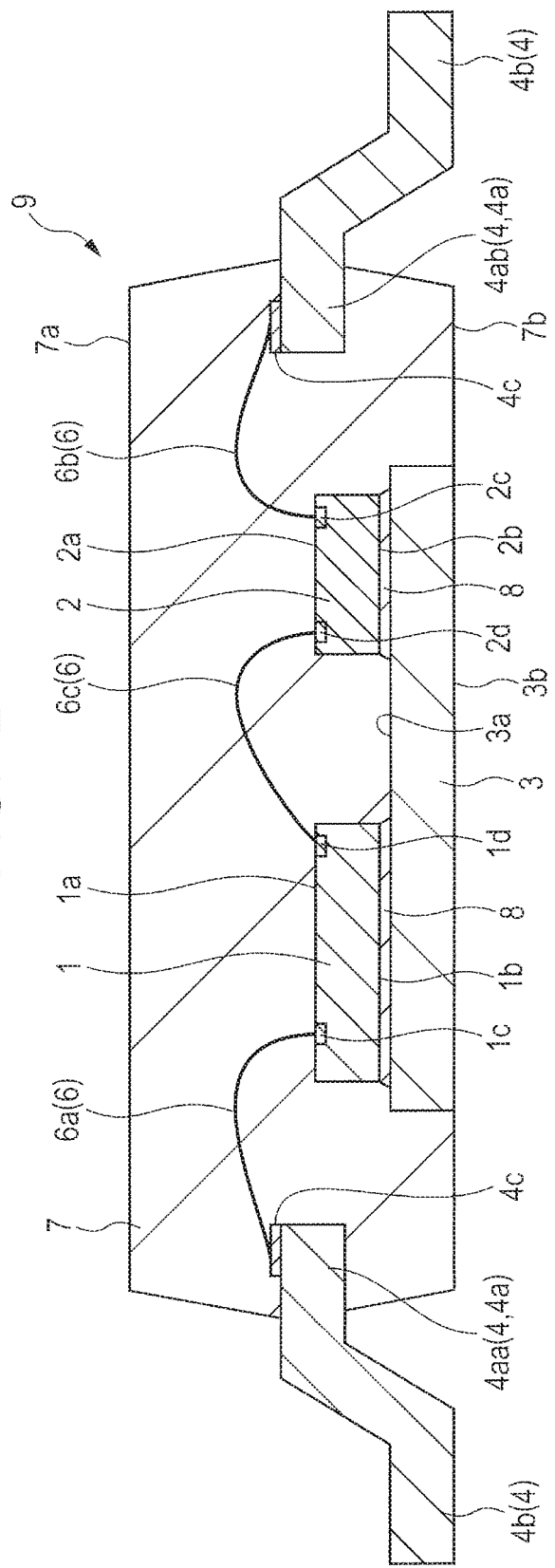
FIG. 2 is a cross-sectional view showing an example of a structure resulting from cutting along the line A-A in FIG. 1.
Figure 3:
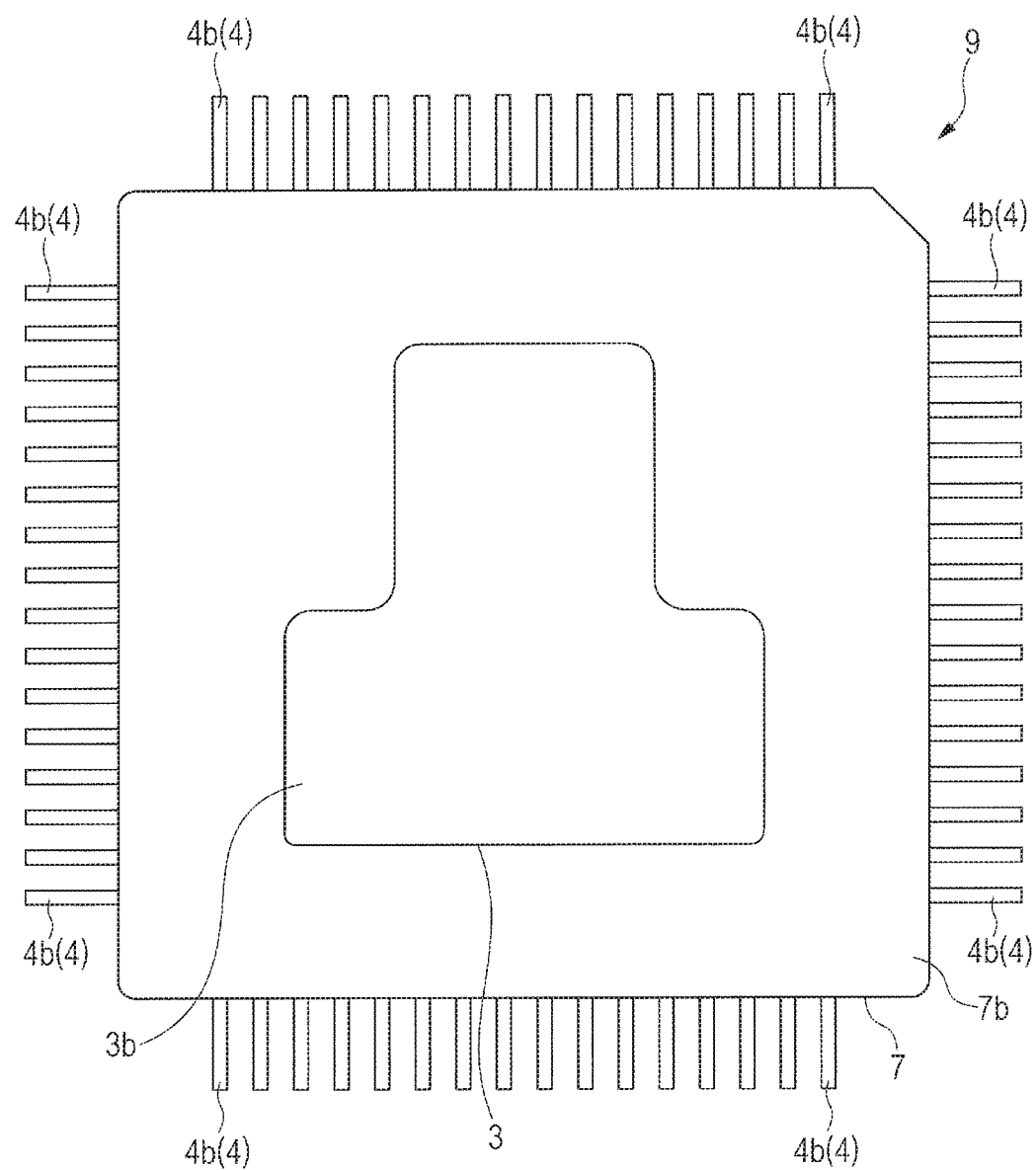
FIG. 3 is a back side view showing an example of the structure of the semiconductor device in FIG. 1.
Figure 4:
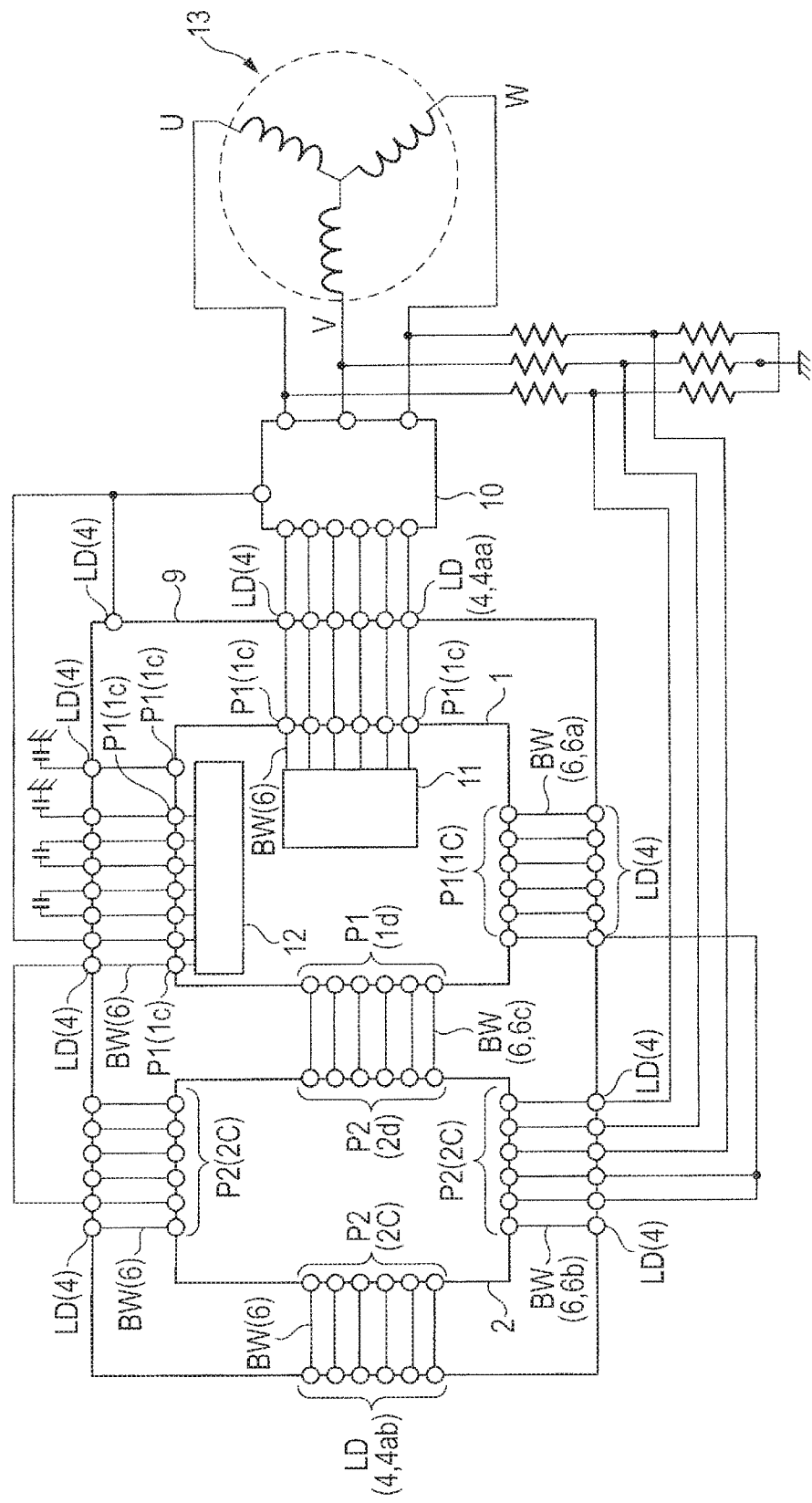
FIG. 4 is a block diagram showing an example of circuits incorporated in the semiconductor device in FIG. 1.

FIG. 1 is a plan view showing an example of a structure of a semiconductor device in an embodiment through the inner portion thereof. FIG. 2 is a cross-sectional view showing an example of a structure resulting from cutting along the line A-A in FIG. 1. FIG. 3 is a back side view showing an example of the structure of the semiconductor device in FIG. 1. FIG. 4 is a block diagram showing an example of circuits incorporated in the semiconductor device in FIG. 1.

The semiconductor device in the present embodiment is a semiconductor device (semiconductor package) in which two semiconductor chips are disposed (mounted or placed) in juxtaposition over a chip mounting portion. In the semiconductor device, the two semiconductor chips are sealed with a sealing resin.

In the present embodiment, as an example of the foregoing semiconductor device, a SIP (System In Package) 9 in which large and small two sized semiconductor chips are disposed in juxtaposition (this chip layout pattern will be hereinafter referred to also as flat layout) will be described. The SIP 9 in the present embodiment is a QFP (Quad Flat Package) type semiconductor device in which the respective outer portions of a plurality of leads protrude from each of the four side surfaces of a sealing body 7 formed of the foregoing sealing resin. Accordingly, each of the outer portions is bent into a gull wing shape and includes a first section extending in a direction away from the sealing body 7, a second portion extending from the first portion toward a back surface 7b of the sealing body 7, and a third portion coupled to the second portion and extending in a direction away from the sealing body 7.

Note that, for example, in the ISP 9 to be mounted in a vehicle or the like, large and small two sized semiconductor chips may be disposed in juxtaposition. By way of example, the present embodiment will describe the case where the semiconductor chip having a main surface larger in size is an analog chip (first semiconductor chip or large chip) 1 and a semiconductor chip having a main surface smaller in size than the analog chip 1 is a microcomputer chip (second semiconductor chip or small chip) 2.

The following will describe a configuration of the SIP 9 shown in FIGS. 1 to 3. The SIP 9 includes the analog chip 1 having a plurality of electrodes formed over the main surface thereof, the microcomputer chip 2 having a main surface smaller in size than a main surface of the analog chip 1 and having a plurality of electrodes formed over the main surface thereof, a die pad (chip mounting portion) 3 over which the analog chip 1 and the microcomputer chip 2 are mounted in juxtaposition, and a plurality of leads 4 arranged so as to surround the die pad 3 in plan view.

The SIP 9 further includes a plurality of (four) suspension leads 5 formed integrally with the die pad 3, a plurality of wires (conductive members) 6 electrically coupling the electrodes of each of the semiconductor chips to the leads 4 corresponding thereto, and the sealing body 7 made of a resin and sealing therein each of the semiconductor chips, a portion of the die pad 3, a portion of each of the plurality of leads 4, and the plurality of wires 6.

A detailed description will be given herein of the individual members included in the SIP 9 described above. The analog chip 1 as the first semiconductor chip has a top surface 1a as a first main surface over which a plurality of electrodes (first electrodes) 1c and a plurality of electrodes (second electrodes) 1d are formed and a back surface 1b opposite to the top surface 1a.

On the other hand, the microcomputer chip 2 as the second semiconductor chip smaller in size than the analog chip 1 in plan view has a top surface 2a as a second main surface over which a plurality of electrodes (third electrodes) 2c and a plurality of electrodes (fourth electrodes) 2d are formed and a back surface 2b opposite to the top surface 2a.

Accordingly, the top surface 1a of the analog chip 1 is larger than the top surface 2a of the microcomputer chip 2.

The top surface 1a of the analog chip 1 has a quadrilateral shape in plan view and has a side 11b provided along a first direction S, a side 11d provided along the first direction S and located opposite to the side 11b, a side 11a provided along a second direction T, and a side 11c provided along the second direction T and located opposite to the side 11a.

On the other hand, the top surface 2a of the microcomputer chip 2 has a quadrilateral shape in plan view and has a side 21b provided along the first direction S, a side 21d provided along the first direction S and located opposite to the side 21b, a side 21a provided along the second direction T, and a side 21c provided along the second direction T and located opposite to the side 21a.

Figure 5:
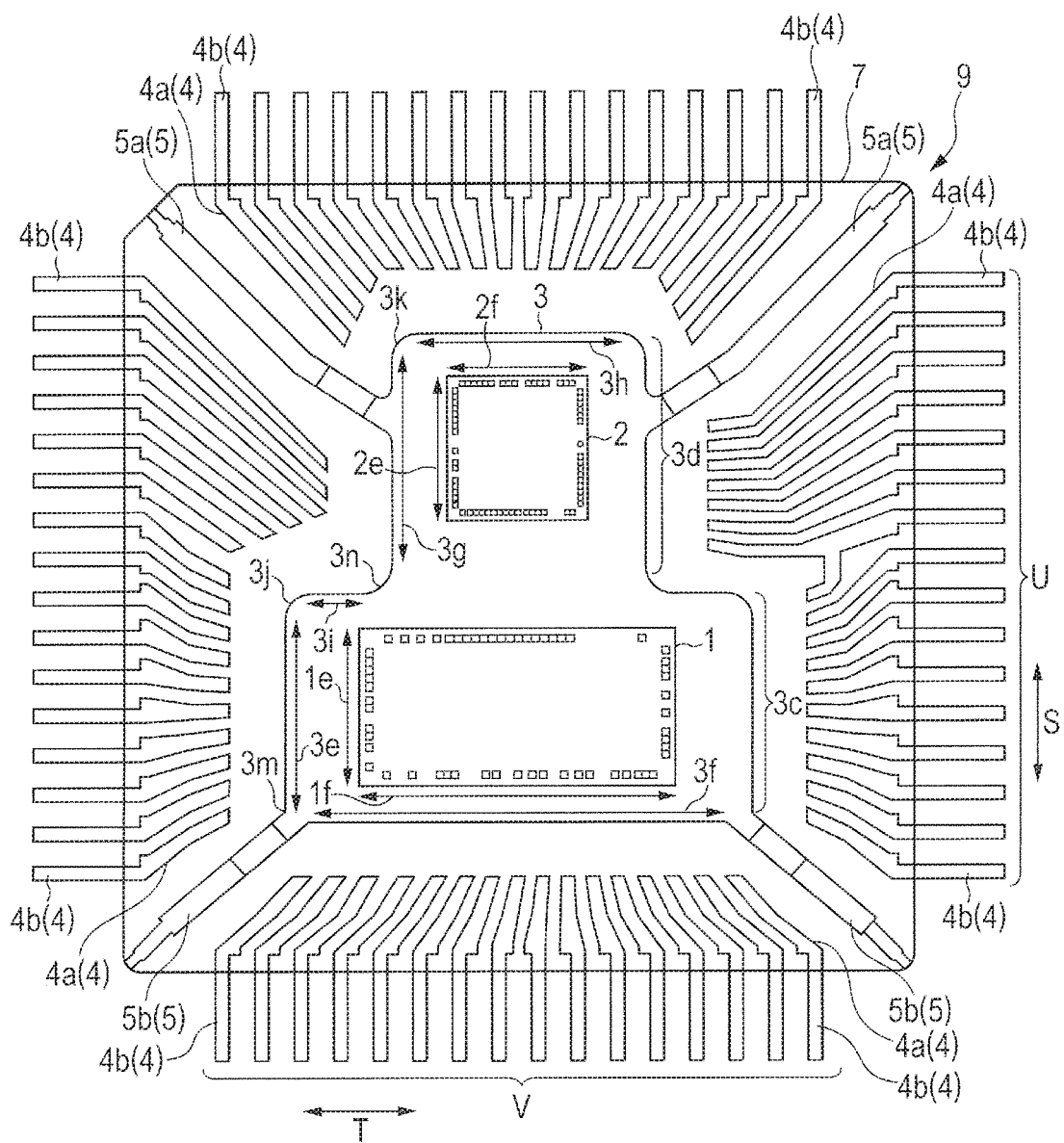
FIG. 5 is a plan view showing an example of an inner structure of the semiconductor device in FIG. 1.

The die pad 3 as the chip mounting portion has an upper surface (third main surface or chip mounting surface) 3a over which the analog chip 1 and the microcomputer chip 2 are mounted in juxtaposition and a lower surface (back surface) 3b opposite to the upper surface 3a. Specifically, the die pad 3 has the upper surface 3a formed in a protruding shape in plan view and includes a first portion 3c as a wider portion and a second portion 3d smaller in width than the first portion 3c, as shown in FIG. 5 described later. In other words, the first portion 3c has a plane area larger than that of the second portion 3d. That is, the first portion 3c in FIG. 17 corresponds to the portion (region or area) enclosed in plan view by a sixth side 3f, a ninth side 3i located opposite to the sixth side 3f, a side 3x (having a length in the second direction T equal to that of the ninth side 3i), a virtual line 3y (connecting the end portion of the ninth side 3i which is located closer to the side 3x in the second direction T and the end portion of the side 3x which is located closer to the ninth side 3i in the second direction) interposed between the ninth side 3i and the side 3x in the second direction T, a fifth side 3e, and a side 3o (having a length in the first direction S equal to that of the fifth side 3e) located opposite to the fifth side 3e. On the other hand, the second portion 3d in FIG. 17 corresponds to the portion (region or area) defined in plan view by an eighth side 3h, the virtual line 3y (having a length in the second direction T longer than that of the eighth side 3h and shorter than that of the sixth side 3f) located opposite to the eighth side 3h, a seventh side 3g, and a side 3z (having a length in the first direction S equal to that of the seventh side 3g) located opposite to the seventh side 3g.

Over the first portion 3c of the die pad 3 which is the region having the larger area, the analog chip 1 having the larger area is mounted. On the other hand, over the second portion 3d of the die pad 3 which is the region having the smaller area, the microcomputer chip 2 having the smaller area is mounted. Note that, as shown in FIG. 2, each of the analog chip 1 and the microcomputer chip 2 is fixed to the upper surface 3a of the die pad 3 via an adhesive material (die bonding material or bonding material) 8.

In the SIP 9, as shown in FIG. 3, the lower surface 3b of the die pad 3 is exposed at the back surface 7b of the sealing body 7 which is opposite to a top surface 7a thereof. That is, the lower surface 3b of the die pad 3 is uncovered with the sealing body 7 (sealing resin).

In the die pad 3, as shown in FIGS. 1 and 2, the area of the upper surface (third main surface) 3a of the die pad 3 is larger than the sum (total) of the respective areas of the top surface (first main surface) 1a of the analog chip 1 and the top surface (second main surface) 2a of the microcomputer chip 2. That is, the SIP 9 in the present embodiment has a large tab structure.

Also, in the SIP 9, as shown in FIG. 1, the four suspension leads 5 connected to the die pad 3 to support the die pad 3 are provided. That is, the die pad 3 is supported at four points by the four suspension leads 5 formed integrally with each other. Specifically, among the four suspension leads 5, two suspension leads (first suspension leads) 5a disposed to face each other are connected to the second portion 3d of the die pad 3 having the smaller area shown in FIG. 5. Other two suspension leads (second suspension leads) 5b disposed to face each other are connected to the first portion 3c of the die pad 3 having the larger area.

The plurality of leads 4 arranged so as to surround the die pad 3 include a plurality of inner leads 4a as inner portions to be embedded in the sealing body 7 and a plurality of outer leads 4b as outer portions connected integrally to the individual inner leads 4a to protrude from the sealing body 7.

The plurality of leads 4 have respective end portions extending toward the die pad 3. Over each of the end portions, a silver plating film 4c shown in FIG. 2 is formed. This allows the coupleability between the wire 6 and the lead 4 to be enhanced.

The plurality of wires 6 include a plurality of wires 6a as first conductive members, a plurality of wires 6b as second conductive members, and a plurality of wires 6c as third conductive members. The plurality of wires 6a electrically couple the plurality of electrodes 1c of the analog chip 1 to a plurality of first leads 4aa (see FIGS. 1 and 2) included in the plurality of leads 4. The plurality of wires 6b electrically couple the plurality of electrodes 2c of the microcomputer chip 2 to a plurality of second leads 4ab (see FIGS. 1 and 2) included in the plurality of leads 4. The plurality of wires 6c electrically couple the plurality of electrodes 1d of the analog chip 1 to the plurality of electrodes 2d of the microcomputer chip 2. That is, each of the plurality of wires 6c is a conductive member which couples, as the wire, the two semiconductor chips directly to each other.

Semiconductor chips such as the analog chip 1 and the semiconductor chip 2 mentioned herein are manufactured by, e.g., forming various semiconductor elements or semiconductor integrated circuits in a main surface of a semiconductor substrate (semiconductor wafer) made of monocrystalline silicon or the like, and then dividing the semiconductor substrate into the individual semiconductor chips by dicing or the like. Each of the foregoing semiconductor chips has a quadrilateral two-dimensional shape crossing the thickness thereof.

The die pad 3, the plurality of leads 4, and the plurality of suspension leads 5 are conductor members each containing, e.g., copper (Cu) as a main component or made of a copper alloy or the like. The die pad 3, the plurality of inner leads 4a, and the plurality of suspension leads 5b have respective surfaces subjected to a roughening process. That is, the planarities of these surfaces are lower than, e.g., the planarities of the back surfaces (1b and 2b) of the semiconductor chips (1 and 2). This can enhance the adhesion between the die pad 3 and the sealing resin of the sealing body 7 and reduce the delamination of the sealing resin from the die pad 3.

As the adhesive material 8, e.g., a conductive (or insulating) paste material or the like can be used.

As the wires 6, conductive members (thin wires) such as, e.g., gold (Au) wires, copper wires, or aluminum (Al) wires can be used.

The sealing body (sealing resin layer, sealing resin, sealing resin portion, or sealing body) 7 is made of, e.g., a resin material such as a thermosetting resin and may also contain a filler or the like. For example, the sealing body 7 can also be formed using an epoxy resin containing a filler or the like.

Next, a description will be given of the circuits included in the analog chip 1 and the microcomputer chip 2 which are mounted in the SIP 9. FIG. 4 is a block diagram showing an example of circuits incorporated in the SIP 9.

As shown in FIG. 4, the analog chip 1 has a pre-driver circuit 11 which controls a 3-phase motor 13 via a driver circuit 10 provided outside the SIP 9 and a regulator circuit 12 which converts a voltage.

Note that the pre-driver circuit 11 and the regulator circuit 12 which are formed in the analog chip 1 are electrically coupled to some of a plurality of electrodes (pad electrodes) P1 of the analog chip 1 via the internal wiring of the analog chip 1. The plurality of electrodes P1 of the analog chip 1 include an input electrode, an output electrode, and a ground electrode. From the electrodes P1, signals (input signals) and a ground potential are input or supplied to the pre-driver circuit 11 and the regulator circuit 12. On the other hand, signals (output signals) output from the pre-driver circuit 11 and the regulator circuit 12 are output from the electrodes P1 mentioned above.

Each of the electrodes P1 of the analog chip 1 is electrically coupled to the lead LD or an electrode P2 of the microcomputer chip 2. Specifically, the electrodes P1 of the analog chip 1 include the electrode P1 (1c) electrically coupled to the lead LD (4 or 4aa) via a wire BW (6 or 6a) and the electrode P1 (1d) electrically coupled to the electrode P2 (2d) of the microcomputer chip 2 via the wire BW (6 or 6c).

On the other hand, the microcomputer chip 2 has a circuit which controls the analog chip 1 and a circuit which senses an output current to the 3-phase motor 13 and performs a feedback operation. Specifically, the microcomputer chip 2 is a control chip and can function as a control semiconductor chip which controls the operation of the analog chip 1.

In FIG. 4, the circuits in the microcomputer chip 2 are not shown, but the internal circuits of the microcomputer chip 2 are electrically coupled to the plurality of electrodes (pad electrodes) P2 of the microcomputer chip 2 via the internal wiring of the microcomputer chip 2. Each of the electrodes P2 of the microcomputer chip 2 is electrically coupled to the lead LD or the electrode P1 of the analog chip 1 via the wire BW. Specifically, the electrodes P2 of the microcomputer chip 2 include the electrode P2 (2c) electrically coupled to the lead LD (4 or 4ab) via the wire BW (6 or 6b) and the electrode P2 (2d) electrically coupled to the electrode P1 (1d) of the analog chip 1 via the wire BW (6 or 6c).

The plurality of leads LD (4 or 4ab) electrically coupled to the microcomputer chip 2 via the wires BW (6 or 6b) include an input lead, an output lead, and a ground lead. From these leads LD, signals (input signals) and the ground potential are input or supplied to the internal circuits of the microcomputer chip 2. On the other hand, the signals (output signals) output from the internal circuits of the microcomputer chip 2 are output from these leads LD.

From the internal regulator circuit 12 of the analog chip 1, a voltage of, e.g., +5 V is supplied to the microcomputer chip 2 via the lead LD. Also, from the regulator circuit 12, a voltage of, e.g., +12 V is supplied to the external pre-driver circuit 11 via the lead LD.

The electrodes P2 (2d), which are among the plurality of electrodes P2 of the microcomputer chip P2, are electrically coupled to the electrodes P1 (1d), which are among the plurality of electrodes P1 of the analog chip 1, via the respective wires BW (6 and 6c). It is possible to electrically couple the internal circuits of the microcomputer chip 2 to the internal circuits of the analog chip 1 via the electrodes P2 of the microcomputer chip 2, the wires BW (wires BW coupling the electrodes P1 and P2 to each other), and the electrodes P1 of the analog chip 1.

The internal circuits of the analog chip 1 correspond to the circuits formed in the analog chip 1, while the internal circuits of the microcomputer chip 2 correspond to the circuits formed in the microcomputer chip 2. The internal wiring of the analog chip 1 corresponds to the wiring formed in the analog chip 1, while the internal wiring of the microcomputer chip 2 corresponds to the wiring formed in the microcomputer chip 2.

Thus, the analog chip 1 as a large chip in the SIP 9 is the semiconductor chip for driving the 3-phase motor 13. Accordingly, the output of the analog chip 1 as well as the amount of heat generated from the driver circuit is large, and therefore it is necessary to enhance the heat dissipation property of the analog chip 1. In the SIP 9 in the present embodiment, by using a large tab structure having a large heat capacity and exposing the lower surface (back surface) 3b of the die pad 3 from the back surface 7b of the sealing body 7, it is possible to enhance the efficiency of heat dissipation from the analog chip 1.

<About Studied Example>

Figure 43:
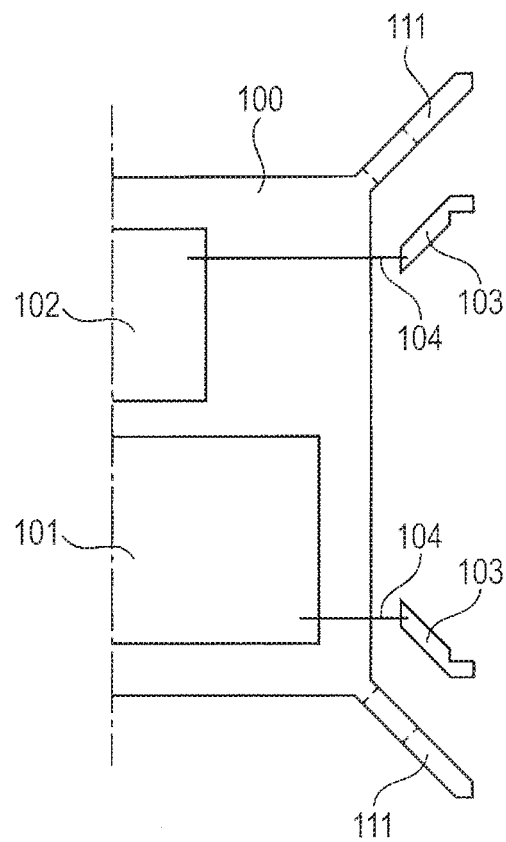
FIG. 43 is a view showing a first studied example of a structure of a comparatively studied semiconductor device.
Figure 44:
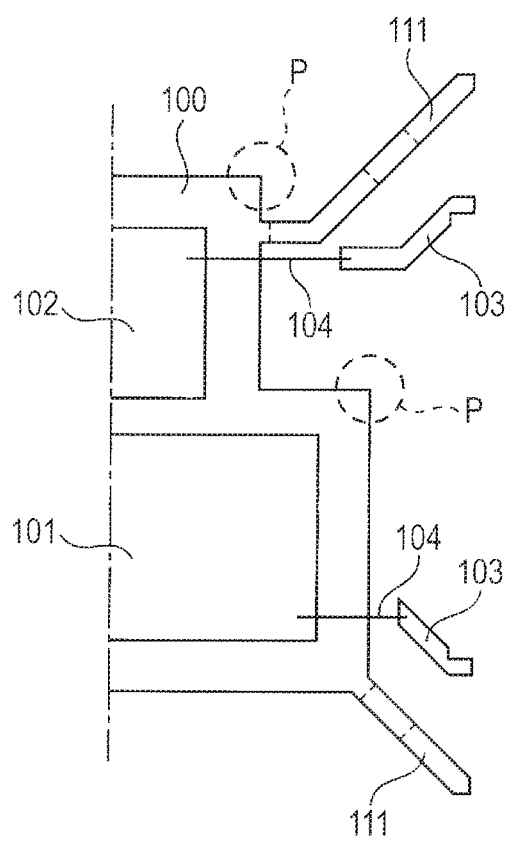
FIG. 44 is a view showing a second studied example of the structure of the comparatively studied semiconductor device.

FIG. 43 is a view showing a first studied example of a structure of a semiconductor device comparatively studied by the prevent inventors. FIG. 44 is a view showing a second studied example of a structure of a semiconductor device comparatively studied by the present inventors.

FIG. 43 shows a portion (right half in plan view) of a structure in which a large chip 101 and a small chip 102 having a main surface smaller in area than a main surface of the large chip 101 are mounted over a die pad 100 having a quadrilateral shape in plan view. As can be seen from FIG. 43, the length of a wire 104 between the small chip 102 (small semiconductor chip) and an inner lead 103 is larger than the length of the wire 104 between the large chip 101 (large semiconductor chip) and the inner lead 103.

Consequently, in the wire 104 coupled to the small chip 102, wire sweep is likely to occur during resin molding.

To prevent this, the present inventors have studied the use of a die pad 110 having a protruding two-dimensional shape. FIG. 44 shows a portion (right half in plan view) of a structure when the die pad 110 having the protruding two-dimensional shape is used. Specifically, the present inventors have conducted study on a structure in which the small chip 102 is mounted over the portion of the protruding die pad 110 which has a smaller area and the tip of the inner lead 103 electrically coupled to the small chip 102 via the wire 104 is located closer to the die pad 110 to thus reduce the length of the wire 104 between the chip and the inner lead 103. As a result, the present inventors have found that, in the structure shown in FIG. 44, it is possible to reduce the wire sweep of the wire 104 coupled to the small chip 102 during the resin molding.

On the other hand, when the large chip 101 is the analog chip 1, as described above, it is necessary to enhance the heat dissipation property of the large chip 101. Accordingly, it is preferable to use a large tab structure (structure in which the area of the die pad 110 is larger than the area of the semiconductor chip) having a protruding shape as shown in FIG. 44 and a large heat capacity.

When the routing of some of the plurality of inner leads 103 electrically coupled to the small chip 102 is changed, in the structure using the die pad 110 having the protruding shape, there are suspension leads 111 which are not coupled to the outside corner portions of the die pad 110, but are coupled to the portions of the sides of the die pad 110. As a result, the plurality of outside corner portions of the die pad 110 include the outside corner portions to which the suspension leads 111 are not connected, as shown in the portions P.

The present inventors have found that a stress resulting from a temperature change in a temperature cycle test or the like is likely to be concentrated on the outside corner portion of the die pad 110 to which the suspension lead 111 is not connected and which is thus exposed. The stress concentrated on the corner portion serves as a starting point of delamination which occurs between the die pad 110 and a resin to degrade the reliability of the semiconductor device.

Characteristic Features of Embodiment

Figure 6:
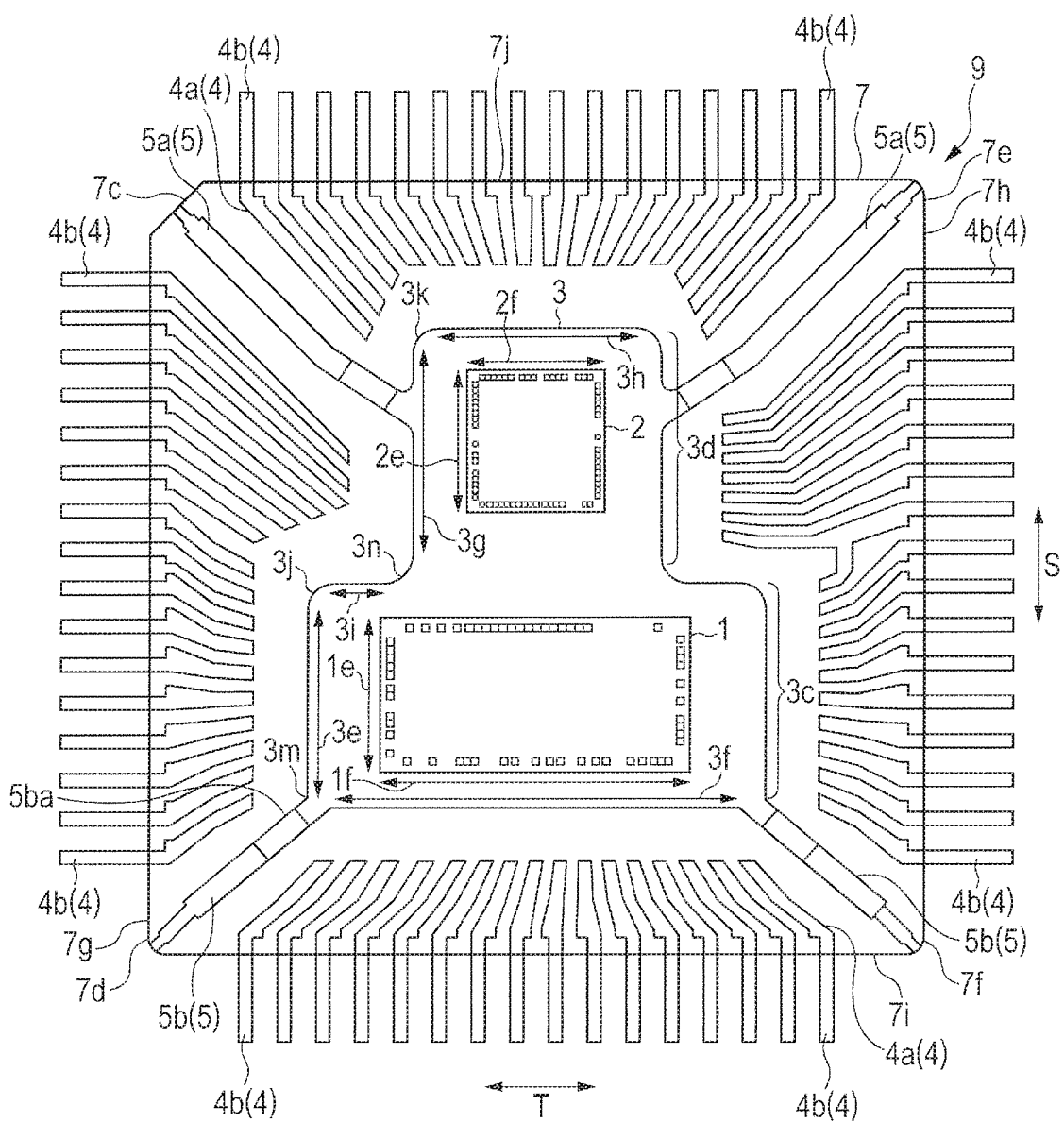
FIG. 6 is a plan view showing the example of the inner structure of the semiconductor device in FIG. 1.
Figure 7:
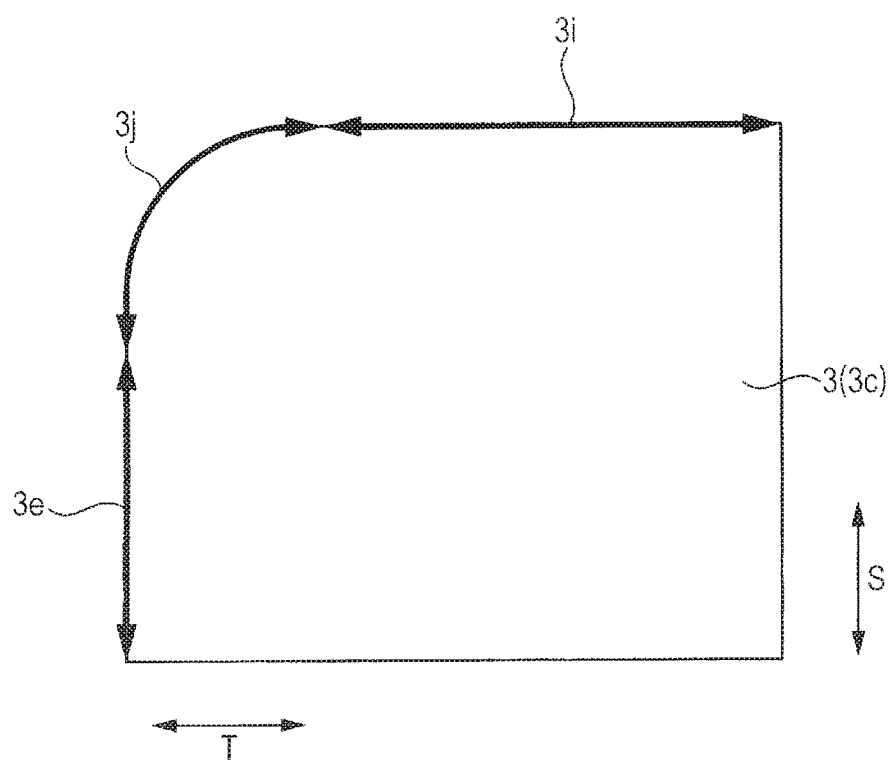
FIG. 7 is an enlarged plan view showing an example of a first curved portion in the semiconductor device in FIG. 1.
Figure 8:
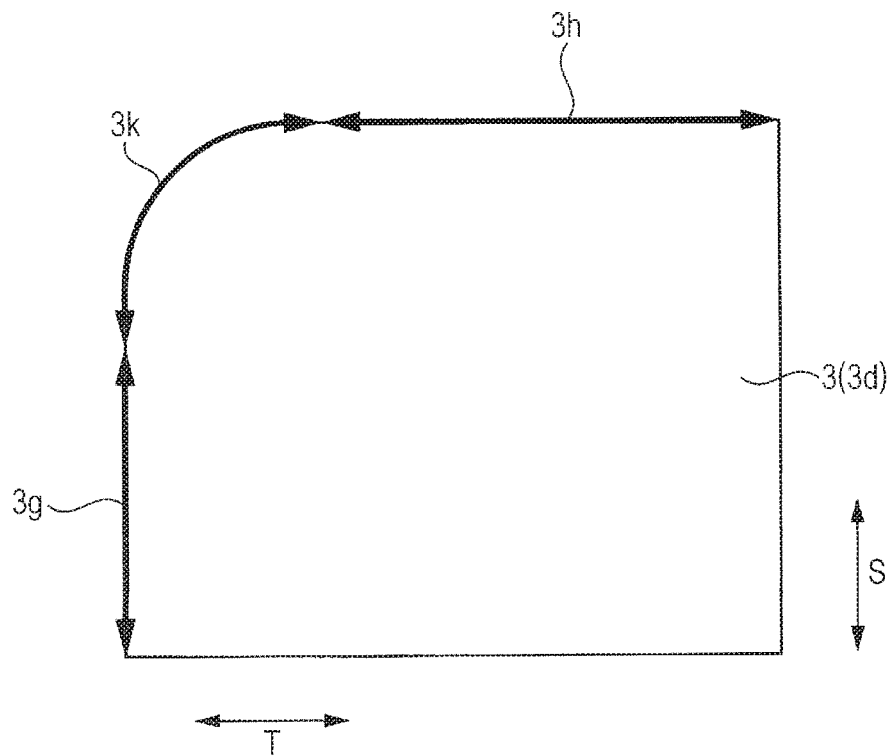
FIG. 8 is an enlarged plan view showing an example of a second curved portion in the semiconductor device in FIG. 1.
Figure 9:
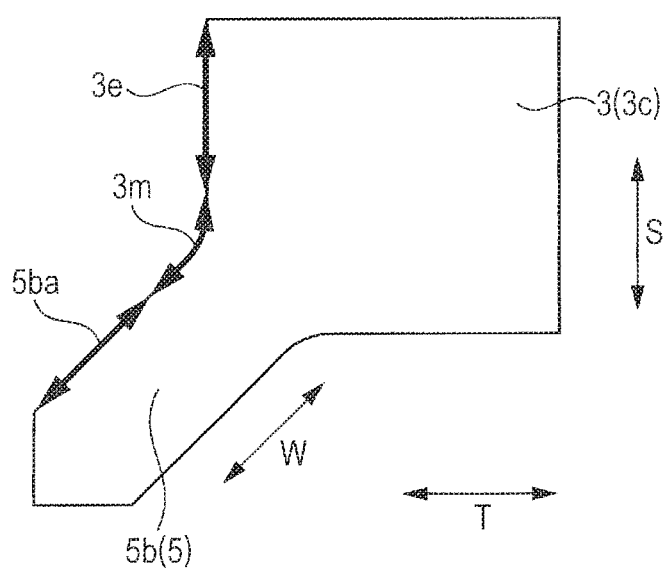
FIG. 9 is an enlarged plan view showing an example of a third curved portion in the semiconductor device in FIG. 1.

FIG. 5 is a plan view showing an example of the inner structure of the semiconductor device in FIG. 1. FIG. 6 is a plan view showing an example of the inner structure of the semiconductor device in FIG. 1. FIG. 7 is an enlarged plan view showing an example of a first curved portion in the semiconductor device in FIG. 1. FIG. 8 is an enlarged plan view showing an example of a second curved portion in the semiconductor device in FIG. 1. FIG. 9 is an enlarged plan view showing an example of a third curved portion in the semiconductor device in FIG. 1. Note that, in the SIP 9 shown in FIGS. 5 and 6, for improved clarity of illustration, the plurality of wires 6 are omitted.

In the description of the characteristic features of the present embodiment, the definitions of the sides and outside corner portions of each of the semiconductor chips and the die pad 3 will be described first.

As shown in FIG. 5, in plan view, the analog chip 1 has the top surface 1a larger in area than the top surface 2a of the microcomputer chip 2 and has a first side 1e extending in the first direction S and a second side if extending in the second direction T crossing the first direction S. On the other hand, in plan view, the microcomputer chip 2 has a third side 2e extending in the first direction S and a fourth side 2f extending in the second direction T.

In other words, the first side 1e of the analog chip 1 and the third side 2e of the microcomputer chip 2 are located along the direction in which the leads 4 are arranged along the first direction S (direction in which the leads in a lead set U are arranged). On the other hand, the second side if of the analog chip 1 and the fourth side 2f of the microcomputer chip 2 are arranged along the direction in which the leads 4 are arranged along the second direction T (direction in which the leads in a lead set V are arranged).

In plan view, the first side 1e of the analog chip 1 and the third side 2e of the microcomputer chip 2 are located between the second side 1f of the analog chip 1 and the fourth side 2f of the microcomputer chip 2.

In plan view, the die pad 3 has the fifth side 3e extending along and adjacent to the first side 1e of the analog chip 1, the sixth side 3f extending along and adjacent to the second side if of the analog chip 1, and the seventh side 3g extending along and adjacent to the third side 2e of the microcomputer chip 2. Also, in plan view, the die pad 3 further has the eighth side 3h extending along and adjacent to the fourth side 2f of the microcomputer chip 2 and the ninth side 3i located between the fifth and seventh sides 3e and 3g of the die pad 3 and extending along the second direction T. In plan view, the sixth side 3f of the die pad 3 is located opposite to the eighth side 3h thereof.

In other words, the fifth and seventh sides 3e and 3g of the die pad 3 are formed along the direction in which the leads in the lead set U are arranged, while the sixth, eighth, and ninth sides 3f, 3h, and 3j of the die pad 3 are formed along the direction in which the leads in the lead set V are arranged.

In still other words, the first portion 3c of the die pad 3 corresponding to a wide portion and serving as a region over which the analog chip 1 is mounted includes the fifth, sixth, and ninth sides 3e, 3f, and 3i. The second portion 3d of the die pad 3 serving as a region which is smaller in width than the first portion 3c and over which the microcomputer chip 2 is mounted includes the seventh and eighth sides 3g and 3h.

Also, in plan view, the plurality of inner leads (leads) 4a disposed in the regions between the suspension leads (first suspension leads) 5a and the suspension leads (second suspension leads) 5b include the plurality of inner leads 4a having the respective tip portions closer to the die pad 3 which are located outside the fifth side 3e of the die pad 3 and the plurality of inner leads 4a having the respective tip portions closer to the die pad 3 which are located inside the fifth side 3e of the die pad 3.

That is, the respective tip portions of the plurality of inner leads 4a disposed in the regions between the suspension leads 5a and the suspension leads 5b include those located outside the fifth side 3e of the die pad 3 and those located inside the fifth side 3e on the basis of the position of the fifth side 3e. In other words, as shown in FIGS. 1 and 6, the plurality of leads 4 crossing a sixteenth side 7g of the sealing body 7 in plan view include the plurality of second leads 4ab electrically coupled to the microcomputer chip 2 via the wires 6b crossing the seventh side 3g of the die pad 3 and the plurality of first leads 4aa electrically coupled to the analog chip 1 via the wires 6a crossing the fifth side 3e of the die pad 3. In the second direction T, the length of each of the plurality of second leads 4ab is longer than the length of each of the plurality of first leads 4aa. In still other words, the coupling points between the wires 6b crossing the seventh side 3g of the die pad 3 and the plurality of second leads 4ab are further away from the sixteenth side 7g of the sealing body 7 in the second direction T than the coupling points between the wires 6a crossing the fifth side 3e of the die pad 3 and the plurality of first leads 4aa.

As also shown in FIG. 6, in plan view, the die pad 3 has a first curved portion 3j continued to each of the fifth and ninth sides 3e and 3i thereof and a second curved portion 3k continued to each of the seventh and eighth sides 3g and 3h thereof.

The sealing body 7 has a generally quadrilateral shape in plan view and has the sixteenth side 7g and a seventeenth side 7h each extending along the first direction S and an eighteenth side 7i and a nineteenth side 7j each extending along the second direction T. The sealing body 7 also has four outside corner portions, i.e., a first outside corner portion 7c located between the sixteenth and nineteenth sides 7g and 7j, a second outside corner portion 7d located between the sixteenth and eighteenth sides 7g and 7i, a third outside corner portion 7e located between the seventeenth and nineteenth sides 7h and 7j, and a fourth outside corner portion 7f located between the seventeenth and eighteenth sides 7h and 7i.

One of the suspension leads (first suspension leads) 5a included in the four suspension leads 5 extends from the seventh side 3g of the die pad 3 toward the first outside corner portion 7c included in the four outside corner portions of the sealing body 7. The other suspension lead 5a located to face the suspension lead 5a extends toward the third outside corner portion 7e which is among the four outside corner portions of the sealing body 7.

That is, the two suspension leads 5a disposed to each other are connected not to the outside corner portions of the die pad 3, but to the sides of the die pad 3 which extend along the first direction S. Accordingly, the suspension lead 5a is not connected to the second curved portion 3k located on the corner of the die pad 3.

On the other hand, one of the suspension leads (second suspension leads) 5b included in the four suspension leads 5 extends from the outside corner portion defined by the fifth and sixth sides 3e and 3f of the die pad 3 toward the second outside corner portion 7d which is among the four outside corner portions of the sealing body 7. The other suspension lead 5b disposed to face the suspension lead 5b extends toward the fourth outside corner portion 7f which is among the four outside corner portions of the sealing body 7. That is, the two suspension leads 5b disposed to face each other are connected to the outside corner portions of the die pad 3.

Also, in plan view, each of the suspension leads 5b has a tenth side 5ba extending from the die pad 3 toward the second outside corner portion 7d of the sealing body 7. In plan view, the die pad 3 has a third curved portion 3m continued to each of the tenth side 5ba of the suspension lead 5b and the fifth side 3e of the die pad 3.

In the SIP 9 in the present embodiment, the radius of curvature of each of the first and second curved portions 3*j* and 3*k* is larger than the radius of curvature of the third curved portion 3*m*. Note that the "radius of curvature" mentioned herein refers to the radius of a circle when a curved line is locally regarded as an arc.

A description will be given herein of the curved portions (curved line portions) of the die pad 3.

The first curved portion 3*j* shown in FIG. 7 is a so-called R-chamfered portion, which is the curved portion formed at the position interposed between the fifth and ninth sides 3*e* and 3*i* of the die pad 3. That is, the first curved portion 3*j* is the R-chamfered portion formed at the outside corner portion defined by the fifth and ninth sides 3*e* and 3*i* of the die pad 3. In other words, the first curved portion 3*j* is the R-chamfered portion located between the fifth and ninth sides 3*e* and 3*i* of the die pad 3 and connected to each of the fifth and ninth sides 3*e* and 3*i*.

Similarly to the first curved portion 3*j*, the second curved portion 3*k* shown in FIG. 8 is also an R-chamfered portion, which is the curved portion formed at the position interposed between the seventh and eighth sides 3*g* and 3*h* of the die pad 3. That is, the second curved portion 3*k* is the R-chamfered portion formed at the outside corner portion defined by the seventh 3*g* and eighth side 3*h* of the die pad 3. In other words, the second curved portion 3*k* is the R-chamfered portion located between the seventh and eighth sides 3*g* and 3*h* of the die pad 3 and connected to each of the seventh and ninth sides 3*g* and 3*i*.

Similarly to the first and second curved portions 3*j* and 3*k*, the third curved portion 3*m* shown in FIG. 9 is also an R-chamfered portion, which is the R-chambered portion at the inside corner portion of the die pad 3. Note that the tenth side 5*ba* of the suspension lead 5*b* extends along a third direction W crossing the first and second directions S and T. Accordingly, the third curved portion 3*m* is the curved portion formed at the position interposed between the fifth side 3*e* of the die pad 3 and the tenth side 5*ba* of the suspension lead 5*b*. That is, the third curved portion 3*m* is the R-chamfered portion formed at the inside corner portion defined by the tenth side 5*ba* of the suspension lead 5*b* and the fifth side 3*e* of the die pad 3. In other words, the third curved portion 3*m* is the R-chamfered portion located between the tenth side 5*ba* of the suspension lead 5*b* and the fifth side 3*e* of the die pad 3 and connected to each of the tenth side 5*ba* of the suspension lead 5*b* and the fifth side 3*e* of the die pad 3.

Each of the fifth and seventh sides 3*e* and 3*g* of the die pad 3 extends along the sixteenth side 7*g* or the seventeenth side 7*h* of the sealing body 7. On the other hand, each of the sixth, eighth, and ninth sides 3*f*, 3*h*, and 3*i* of the die pad 3 extends along the eighteenth side 7*i* or the nineteenth side 7*j* of the sealing body 7. The first curved portion 3*j* is one of the outside corner portions (exposed outside corner portions) to which the suspension leads 5 of the first portion 3*c* of the die pad 3 are not connected. On the other hand, the second curved portion 3*k* is one of the outside corner portions (exposed outside corner portions) to which the suspension leads 5 of the second portion 3*d* of the die pad 3 are not connected.

In the first, second, and third curved portions 3*j*, 3*k* and 3*m* described above, the radius of curvature of each of the first and second curved portions 3*j* and 3*k* is larger than the radius of curvature of the third curved portion 3*m*.

Figure 10:
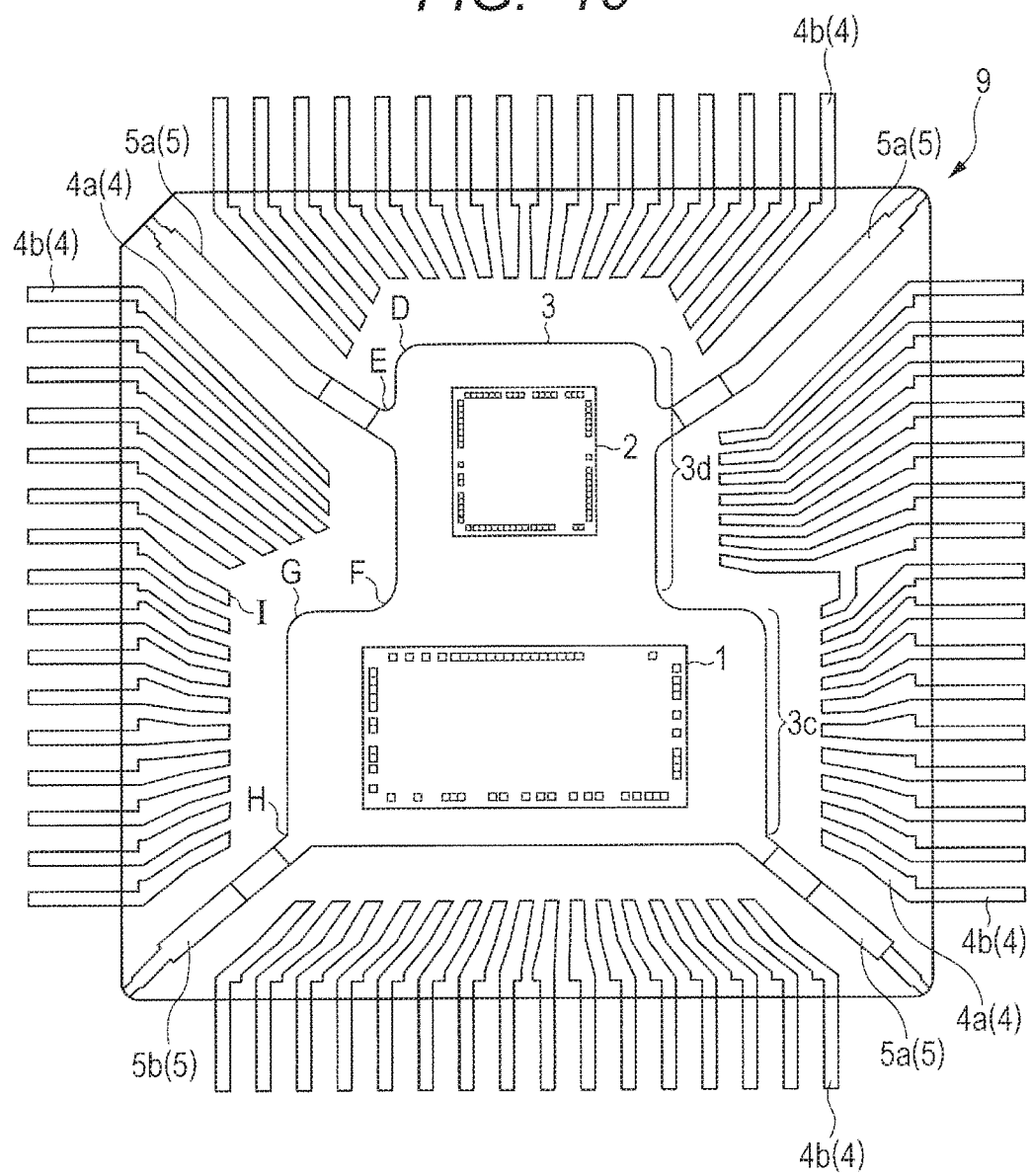
FIG. 10 is a plan view showing an example of an inner structure of the semiconductor device in FIG. 1 from which wires are omitted.
Figure 11:
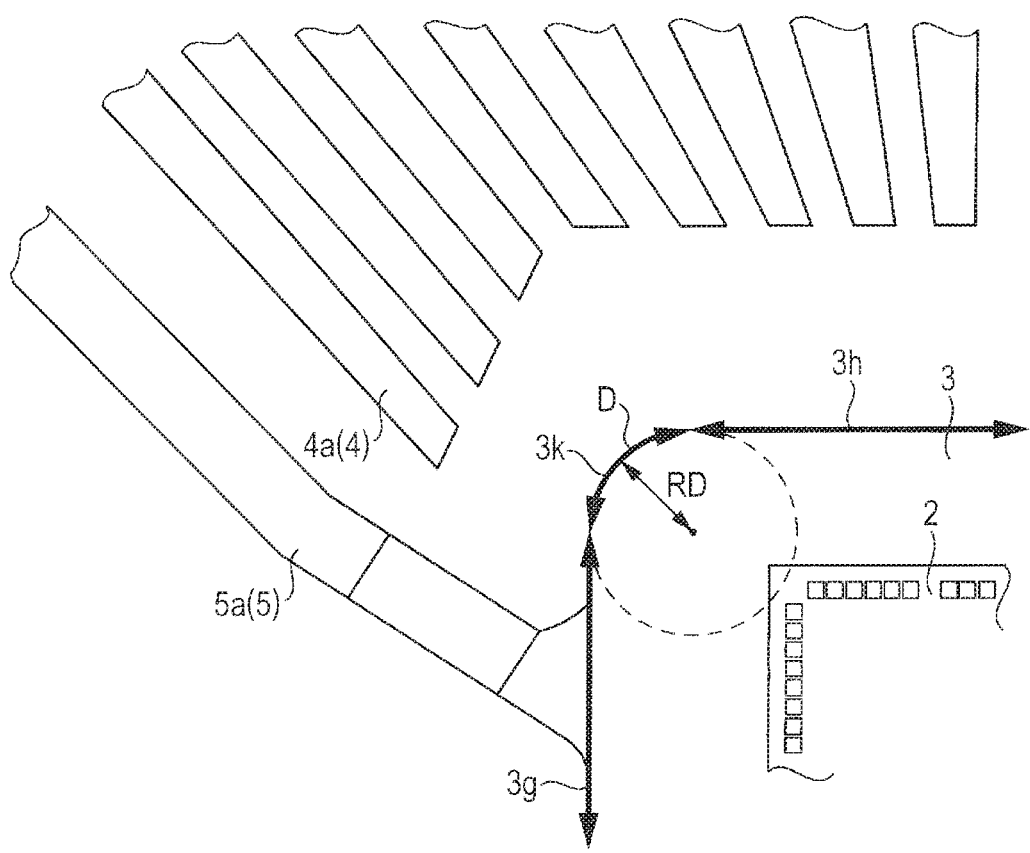
FIG. 11 is a partially enlarged plan view showing a structure of a curved portion as a portion D in FIG. 10.
Figure 12:
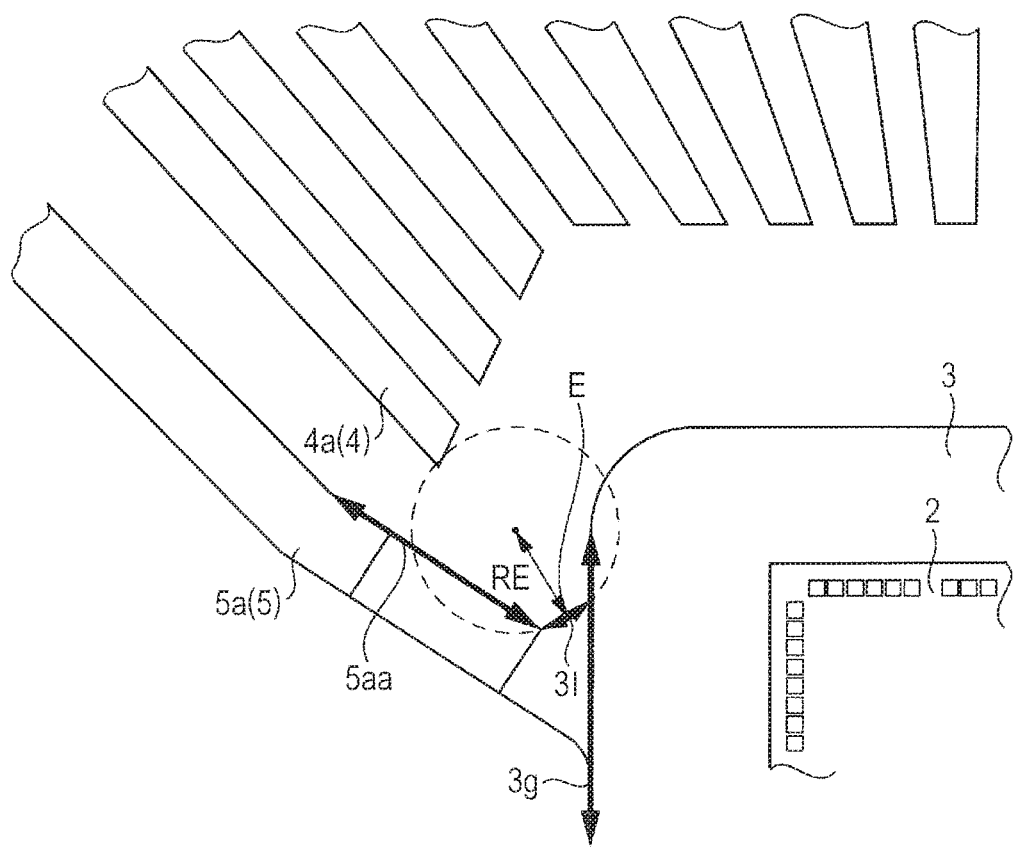
FIG. 12 is a partially enlarged plan view showing a structure of a curved portion as a portion E in FIG. 10.
Figure 13:
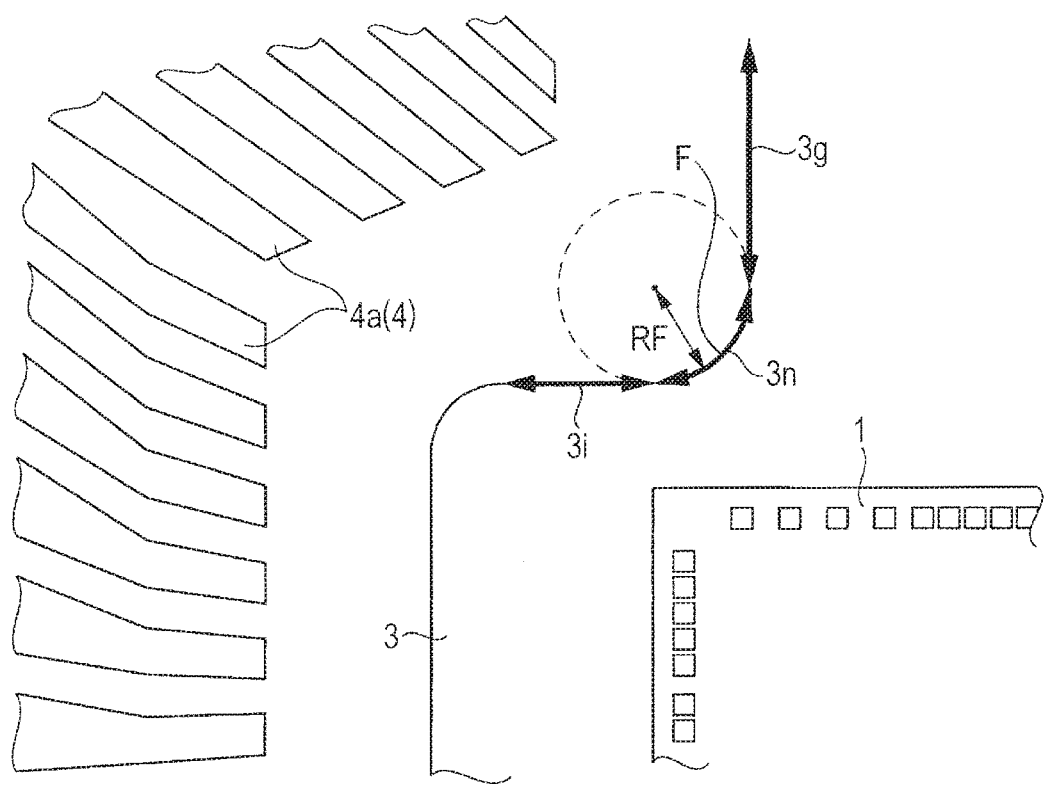
FIG. 13 is a partially enlarged plan view showing a structure of a curved portion as a portion F in FIG. 10.
Figure 14:
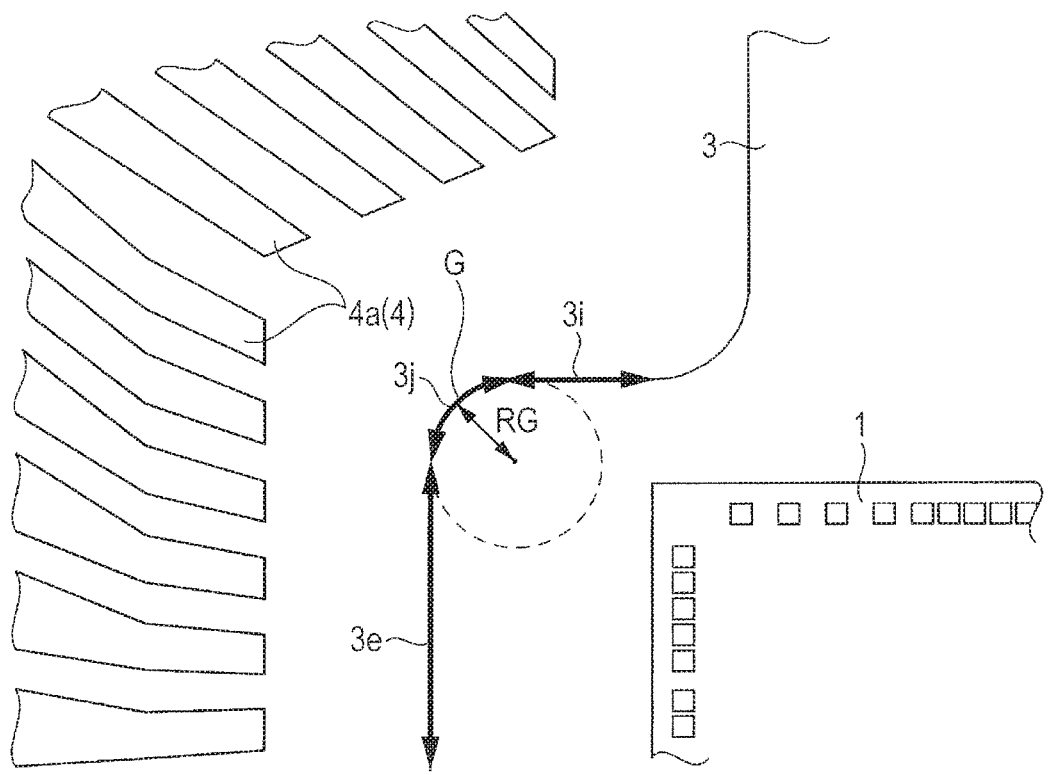
FIG. 14 is a partially enlarged plan view showing a structure of a curved portion as a portion G in FIG. 10.
Figure 15:
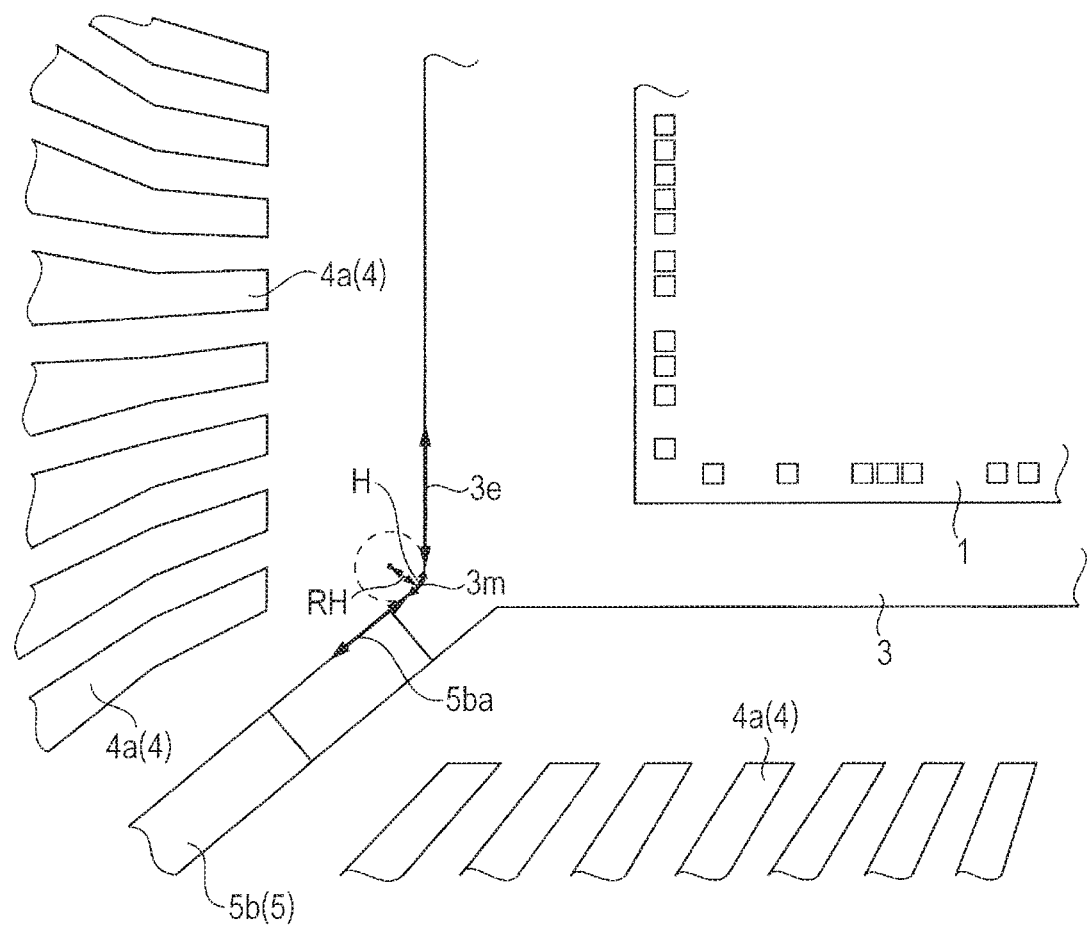
FIG. 15 is a partially enlarged plan view showing a structure of a curved portion as a portion H in FIG. 10.
Figure 16:
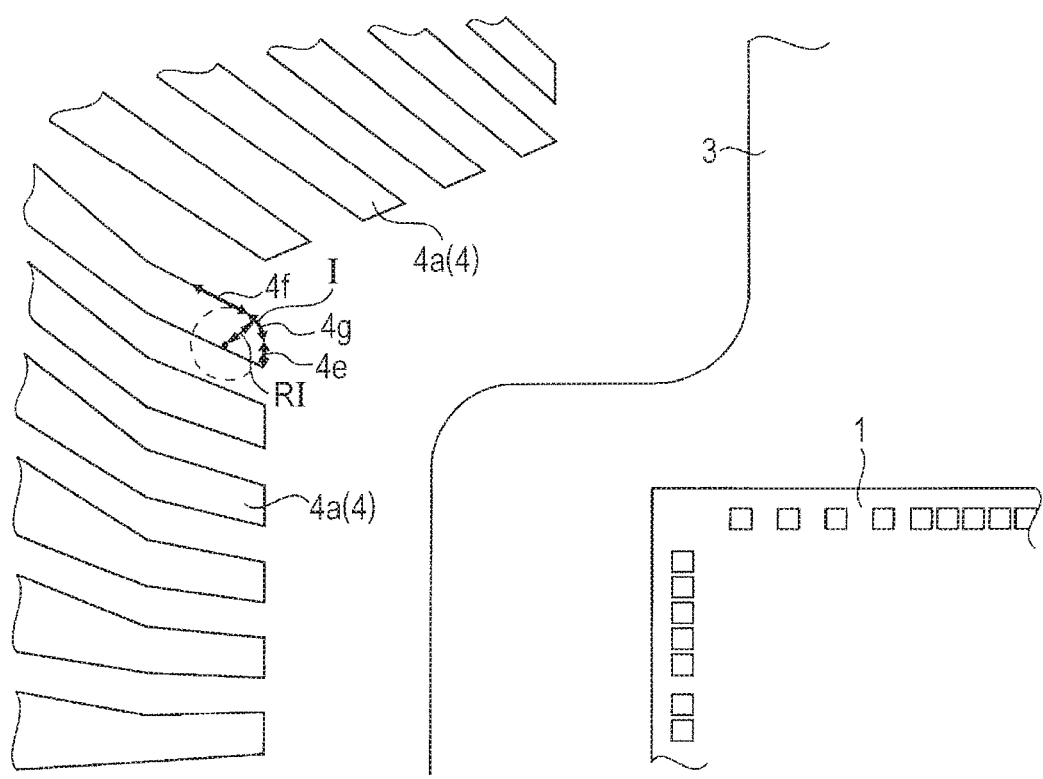
FIG. 16 is a partially enlarged plan view showing a structure of a curved portion as a portion I in FIG. 10.

The following will show an example of the sizes of the individual outside corner portions (including also the inside corner portions) of the die pad 3 and the leads 4 in the SIP 9. FIG. 10 is a plan view showing an example of the inner structure of the semiconductor device in FIG. 1 from which the wires are omitted. FIG. 11 is a partially enlarged plan view showing a structure of a curved portion as a portion D in FIG. 10. FIG. 12 is a partially enlarged plan view showing a structure of a curved portion as a portion E in FIG. 10. FIG. 13 is a partially enlarged plan view showing a structure of a curved portion as a portion F in FIG. 10. FIG. 14 is a partially enlarged plan view showing a structure of a curved portion as a portion G in FIG. 10. FIG. 15 is a partially enlarged plan view showing a structure of a curved portion as a portion H in FIG. 10. FIG. 16 is a partially enlarged plan view showing a structure of a curved portion as a portion I in FIG. 10.

The following is a description of exemplary values of the radius of curvature of each of the outside corner portions (including also the inside corner portions) of the structure shown in FIG. 10. The radius of curvature of the portion D (the second curved portion 3*k* located between the eighth and seventh sides 3*h* and 3*g* shown in FIG. 11 and connected to each of the eighth and seventh sides 3*h* and 3*g*) is given by RD=0.3 mm. The radius of curvature of the portion E (a curved portion 3*l* located between the seventh side 3*g* and one side 5*aa* of the suspension lead 5*a* each shown in FIG. 12 and connected to each of the seventh side 3*g* and the side 5*aa* of the suspension lead 5*a*) is given by RE=0.4 mm. The radius of curvature of the portion F (a fourth curved portion 3*n* located between the seventh and ninth sides 3*g* and 3*i* shown in FIG. 13 and connected to each of the seventh and ninth sides 3*g* and 3*i*) is given by RF=0.4 mm. The radius of curvature of the portion G (the first curved portion 3*j* located between the ninth and fifth sides 3*i* and 3*e* shown in FIG. 14 and connected to each of the ninth and fifth sides 3*i* and 3*e*) is given by RG=0.3 mm. The radius of curvature of the portion H (the third curved portion 3*m* located between the fifth side 3*e* and the tenth side 5*ba* of the suspension lead 5*b* each shown in FIG. 15 and connected to each of the fifth side 3*e* and the tenth side 5*ba* of the suspension lead 5*b*) is given by RH=0.125 mm (Max). The radius of curvature of the portion I (a curved portion 4*g* located between the one side 4*f* of the lead 4 and the side 4*e* of the tip portion of the lead 4 each shown in FIG. 16 and connected each of to the sides 4*f* and 4*e*) is given by RI=0.125 mm (Max). Note that the R-chamfered portion of the portion I of the tip of the lead 4 is formed only when the lead frame is processed by etching.

It will be understood that, thus, in the foregoing example of the numerical values of the SIP 9 also, each of the radius of curvature (R=0.3 mm) of the first curved portion 3*j* and the radius of curvature (R=0.3 mm) of the second curved portion 3*k* is larger than the radius of curvature (R=0.125 mm (Max)) of the third curved portion 3*m*.

The radius of curvature of the curved portion F (fourth curved portion 3*n*) in FIG. 10 is larger than the radius of curvature of the third curved portion 3*m*. The radius of curvature of each of the first and second curved portions 3*j* and 3*k* and the curved portion (fourth curved portion 3*n*) as the foregoing portion F is larger than the radius of curvature of the curved portion as the portion I in FIG. 10.

Note that, when the die pad 3 and the lead pattern of the plurality of leads 4, the plurality of suspension leads 5, and the like are formed by an etching process, the outside and inside corner portions of the first, second, and third curved portions 3*j*, 3*k*, and 3*m* and the like can be formed in the same process step during the formation of the lead frame.

<Method of Manufacturing Semiconductor Device>

Figure 17:
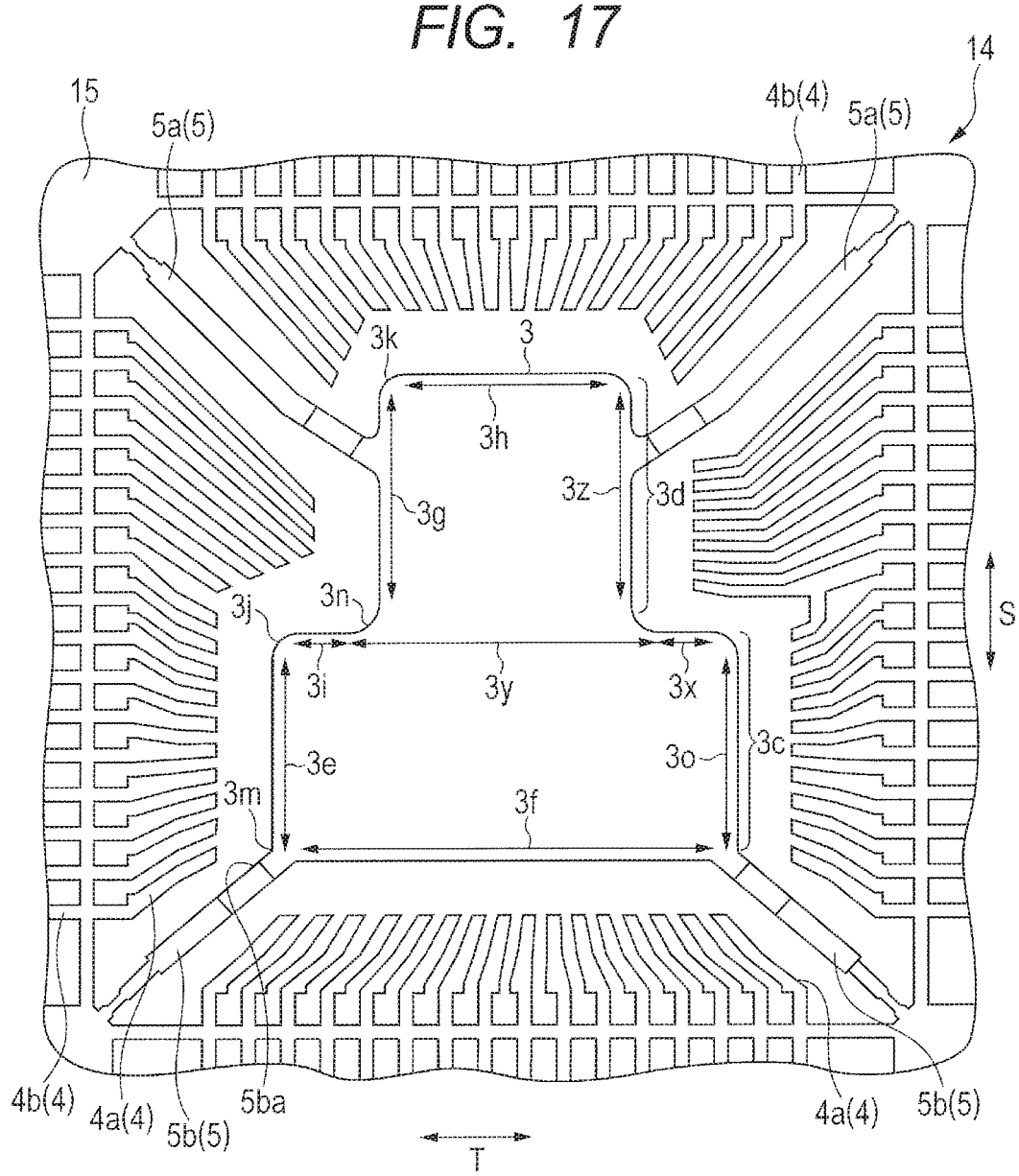
FIG. 17 is a partial plan view showing an example of a structure of a lead frame used in the assembly of the semiconductor device in FIG. 1.
Figure 18:
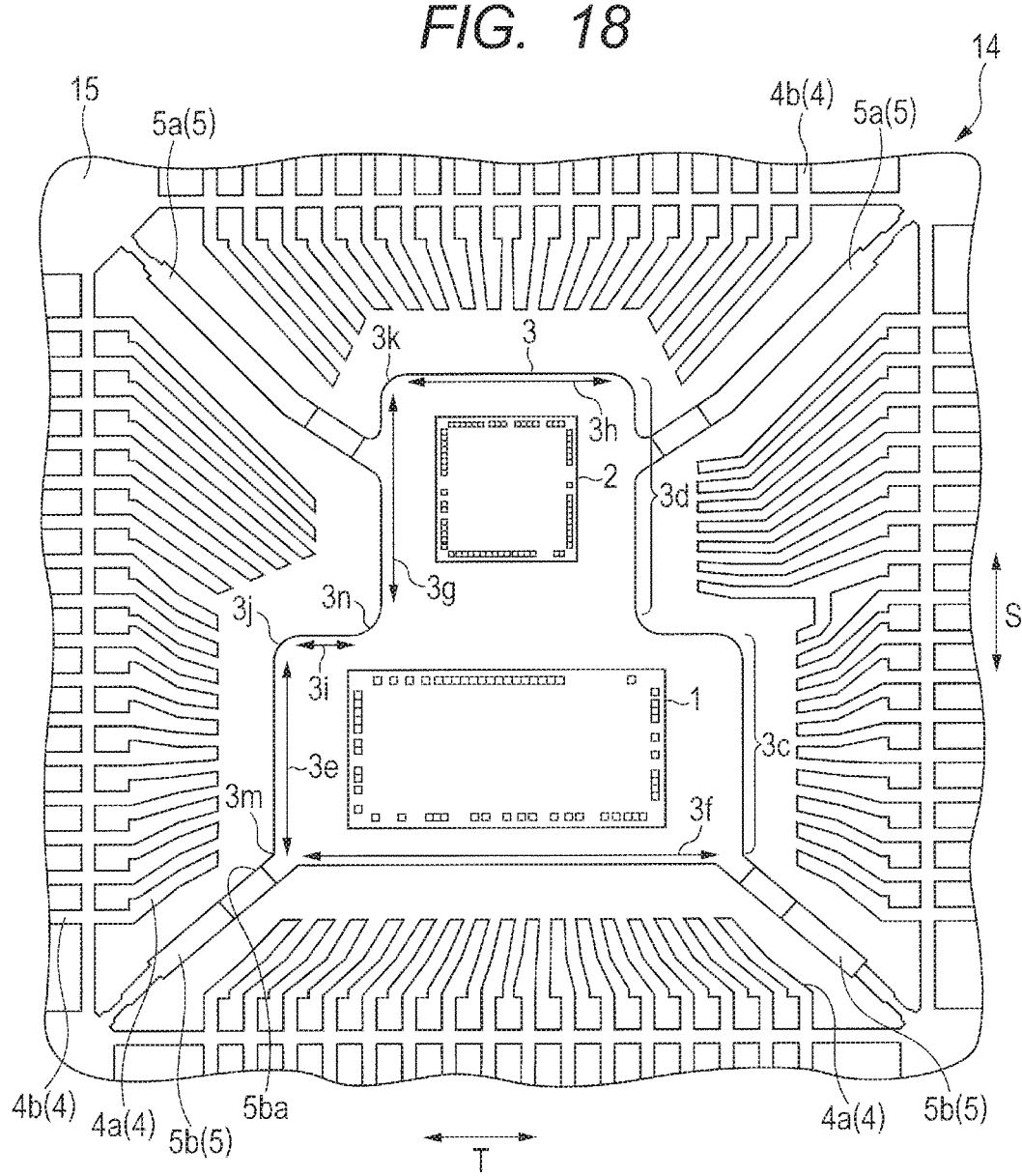
FIG. 18 is a partial plan view showing an example of a structure after die bonding in the assembly of the semiconductor device in FIG. 1.
Figure 19:
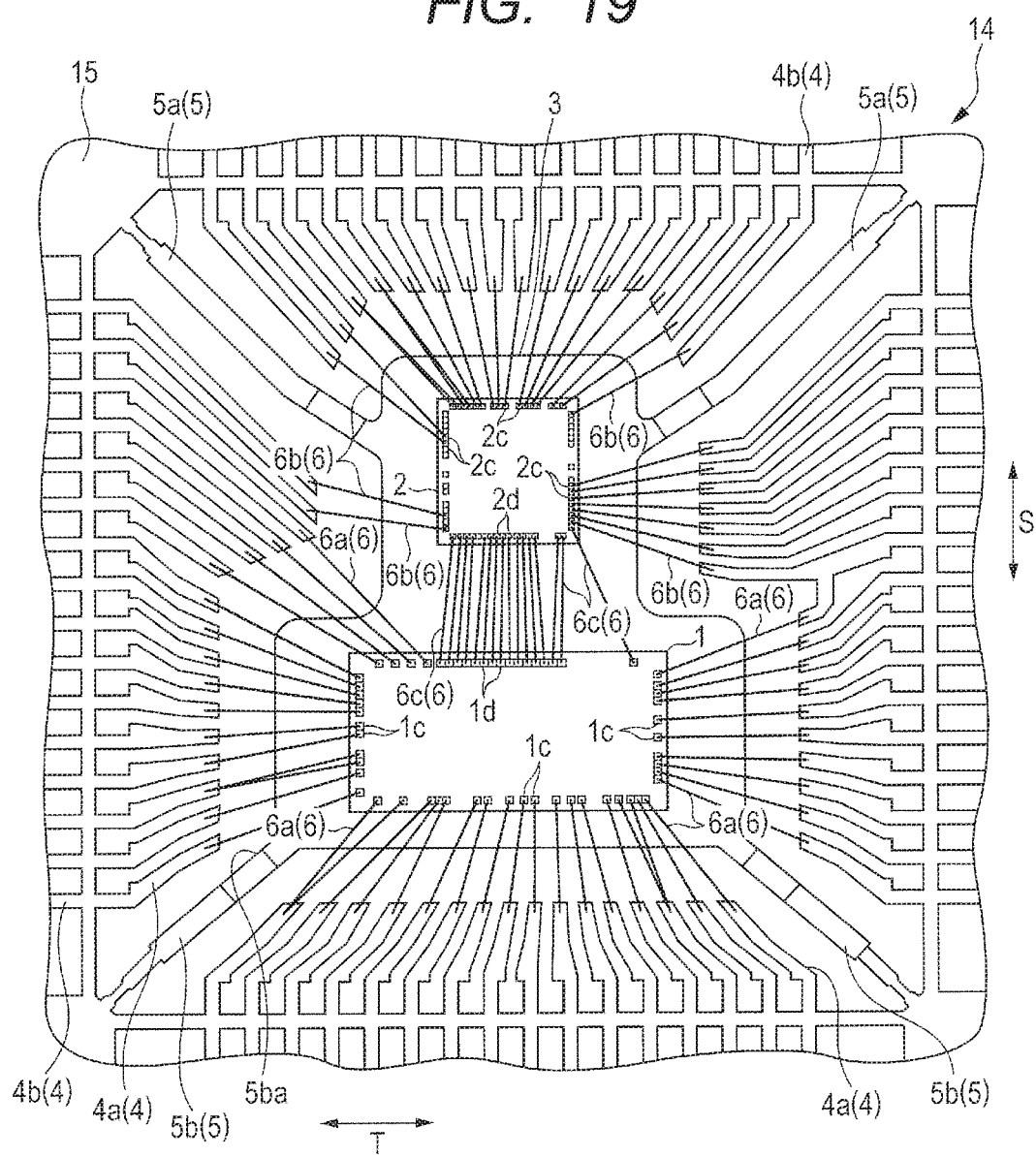
FIG. 19 is a partial plan view showing an example of a structure after wire bonding in the assembly of the semiconductor device in FIG. 1.
Figure 20:
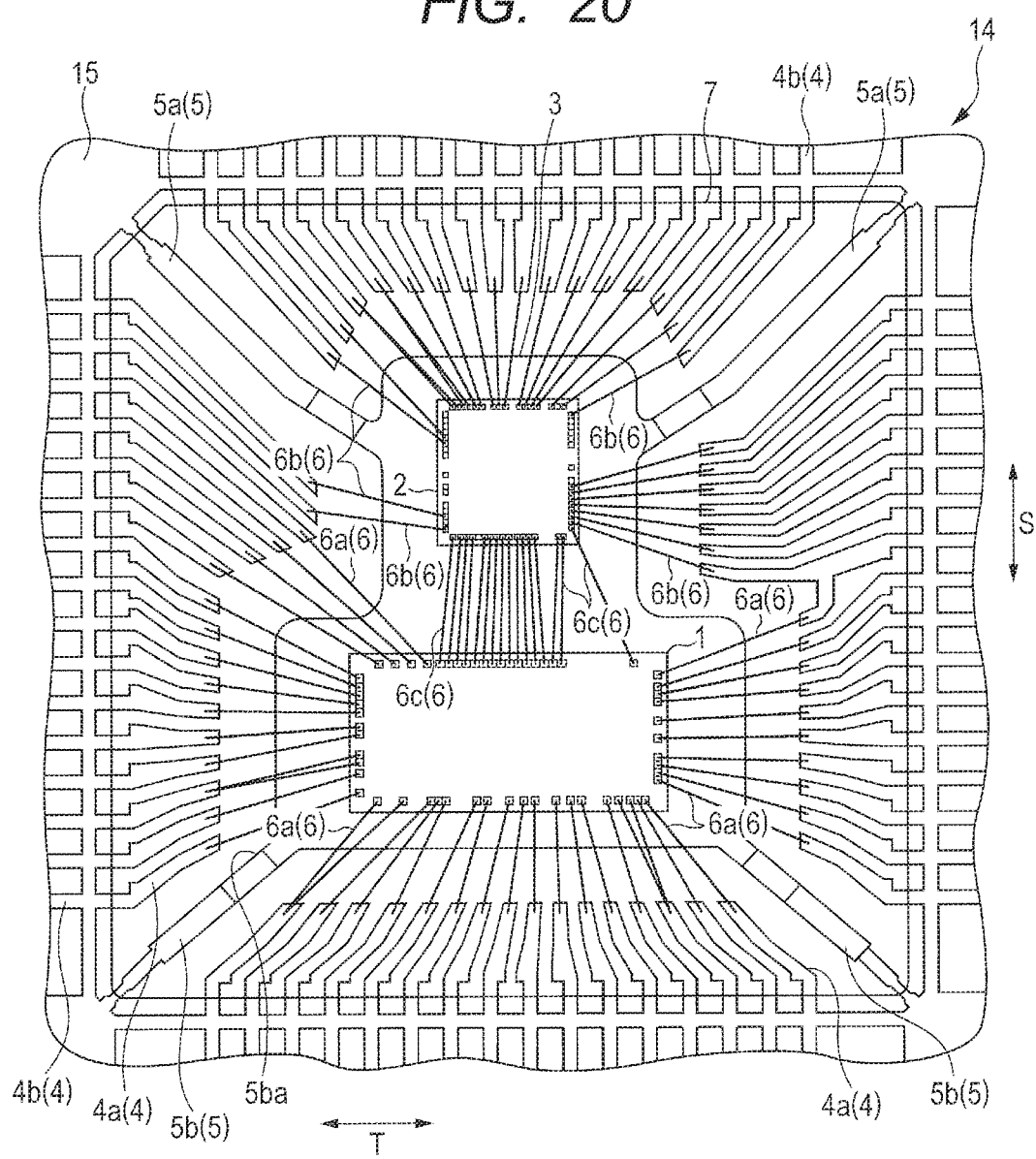
FIG. 20 is a partial plan view showing an example of a structure after resin molding in the assembly of the semiconductor device in FIG. 1.
Figure 21:
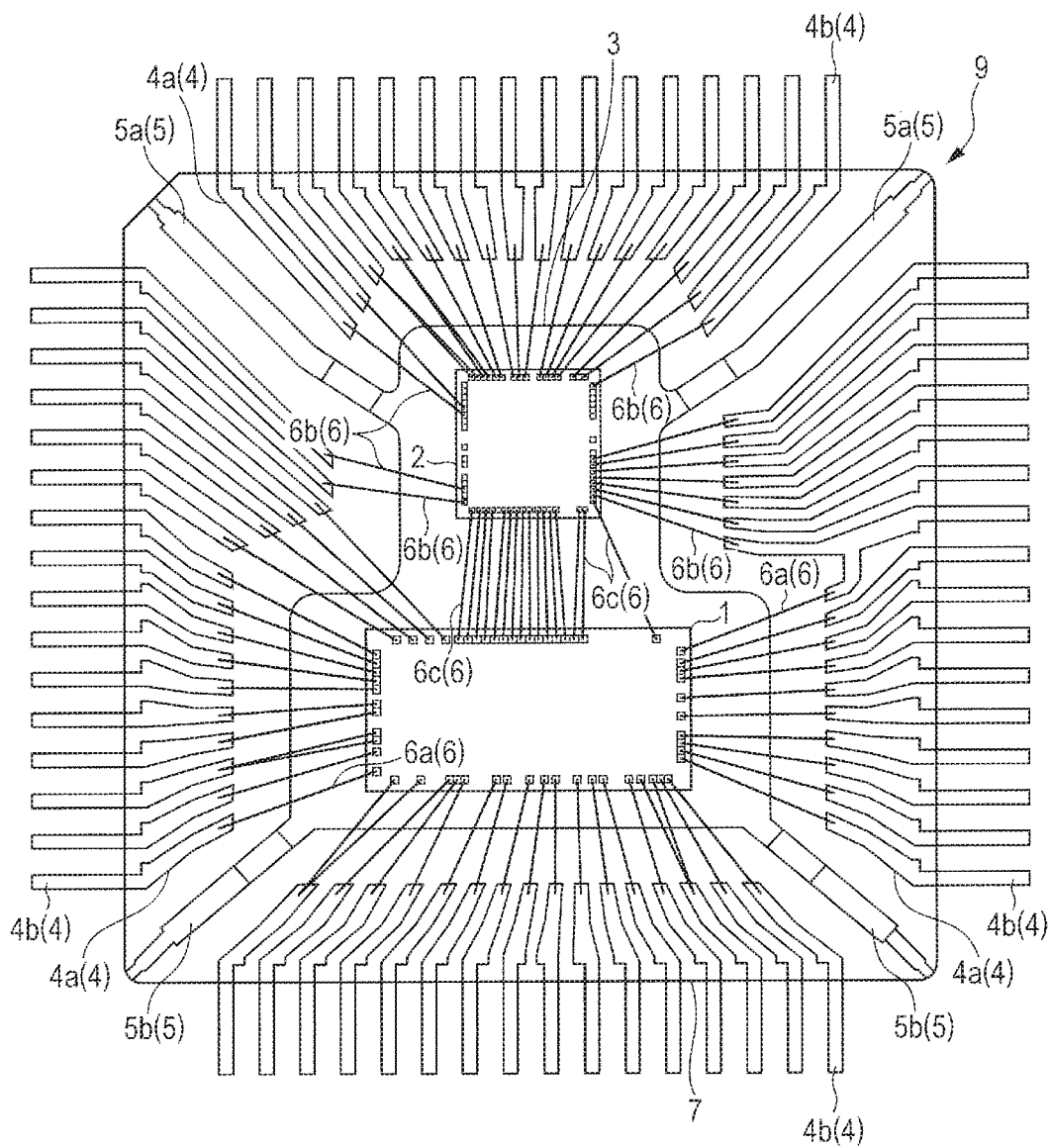
FIG. 21 is a plan view showing an example of a structure after cutting/forming in the assembly of the semiconductor device in FIG. 1.

FIG. 17 is a partial plan view showing an example of a structure of the lead frame used in the assembly of the semiconductor device in FIG. 1. FIG. 18 is a partial plan view showing an example of a structure after die bonding in the assembly of the semiconductor device in FIG. 1. FIG. 19 is a partial plan view showing an example of a structure after wire bonding in the assembly of the semiconductor device in FIG. 1. FIG. 20 is a partial plan view showing an example of a structure after resin molding in the assembly of the semiconductor device in FIG. 1. FIG. 21 is a plan view showing an example of a structure after cutting/forming in the assembly of the semiconductor device in FIG. 1.

Next, a description will be given of the manufacturing process (assembly process) of the semiconductor device shown in FIGS. 17 to 21. Note that FIGS. 17 to 21 show the only one package region of the lead frame used in the assembly process of the semiconductor device. However, the lead frame used in real assembly has a plurality of the foregoing package regions formed therein.

Also, the present embodiment will describe the case where the lead pattern in the lead frame is processed by etching.

To manufacture the SIP 9 as the semiconductor device, first, a lead frame 14 shown in FIG. 17, the analog chip 1 shown in FIG. 1, and the microcomputer chip 2 shown in FIG. 1 and having the top surface 2a smaller in area than the top surface 1a of the analog chip 1 are provided. The lead frame 14 integrally has a frame portion 15 as a framework, the plurality of leads 4 connected to the fame portion 15, and the die pad 3 connected to the frame portion 15 via the plurality of suspension leads 5.

Note that the provision of the lead frame 14, the provision of the analog chip 1, and the provision of the microcomputer chip 2 may be performed in any order or performed simultaneously.

The following will describe a detailed structure of one of the package regions of the lead frame 14. The package region of the lead frame 14 has the die pad 3, the plurality of leads 4 arranged so as to surround the die pad 3, and the plurality of suspension leads 5 formed integrally with the die pad 3. In plan view, the die pad 3 has the first portion 3c as the wide portion and the second portion 3d smaller in width than the first portion 3c.

Note that the first portion 3c in FIG. 17 corresponds to the portion (region or area) enclosed in plan view by the sixth side 3f, the ninth side 3i located opposite to the sixth side 3f, the side 3x (having a length in the second direction T equal to that of the ninth side 3i), the virtual line 3y interposed between the ninth side 3i and the side 3x in the second direction T (virtual line 3y connecting the end portion of the ninth side 3i located closer to the side 3x in the second direction T and the end portion of the side 3x located closer to the ninth side 3i in the second direction T), the fifth side 3e, and the side 3o (having a length in the first direction S equal to that of the fifth side 3e) located opposite to the fifth side 3e. The second portion 3d in FIG. 17 corresponds to the portion (region or area) enclosed in plan view by the eighth side 3h, the virtual line 3y (having a length in the second direction T longer than that of the eighth side 3h and shorter than that of the sixth side 3f) located opposite to the eighth side 3h, the seventh side 3g, and the side 3z (having a length in the first direction S equal to that of the seventh side 3g) located opposite to the seventh side 3g.

Of the first portion 3c of the die pad 3, the outside corner portion defined in plan view by the fifth side (eleventh side) 3e extending along the first direction S and the ninth side (twelfth side) 3i connected to the fifth side (eleventh side) 3e and extending along the second direction T crossing the first direction S is assumed to be the first curved portion 3j.

Also, of the second portion 3d of the die pad 3, the outside corner portion defined in plan view by the seventh side (thirteenth side) 3g extending along the first direction S and the eighth side (fourteenth side) 3h connected to the seventh side 3g and extending along the second direction T is assumed to be the second curved portion 3k.

Also, when it is assumed that the inside corner portion defined in plan view by the tenth side (fifteenth side) 5ba of the suspension lead (second suspension lead) 5b connected to the outside corner portion of the first portion 3c of the die pad 3 and the fifth side (eleventh side) 3e of the first portion 3c of the die pad 3 connected to the tenth side 5ba is the third curved portion 3m, the radius of curvature of each of the first and second curved portions 3j and 3k is larger than the radius of curvature of the third curved portion 3m.

After the lead frame 14, the analog chip 1, and the microcomputer chip 2 are provided, as shown in FIGS. 2 and 18, the analog chip 1 and the microcomputer chip 2 having the top surface 2a which is smaller in plane area than the top surface 1a of the analog chip 1 are mounted over the upper surface 3a of the die pad 3 of the lead frame 14. That is, the die bonding step for the analog chip 1 and the microcomputer chip 2 is performed.

As shown in FIG. 2, over the first portion 3c of the die pad 3 of the lead frame 14, the analog chip 1 is mounted via the adhesive material 8 to be bonded to the first portion 3c. Also, over the second portion 3d of the die pad 3 of the lead frame 14, the microcomputer chip 2 is mounted via the adhesive material 8 to be bonded to the second portion 3d.

After the die bonding step is performed, the wire bonding step shown in FIG. 19 is performed.

That is, as shown in FIG. 2, the plurality of electrodes 1c of the analog chip 1 are electrically coupled to the plurality of first leads 4aa of the lead frame 14 via the plurality of wires 6a. Also, the plurality of electrodes 2c of the microcomputer chip 2 are electrically coupled to the plurality of second leads 4ab of the lead frame 14 via the plurality of wires 6b. Also, the plurality electrodes 1d of the analog chip 1 are electrically coupled to the plurality of electrodes 2d of the microcomputer chip 2 via the plurality of wires 6c.

After the wire bonding step is performed, the resin molding step shown in FIG. 20 is performed. That is, resin sealing is performed by a molding step (resin molding step) to seal the analog chip 1, the microcomputer chip 2, a portion of the die pad 3, a portion (inner portion) of each of the plurality of leads 4, and the plurality of wires 6 with a resin and form the sealing body 7.

In the present embodiment, as shown in FIG. 2, the sealing body 7 is formed such that the lower surface 3b of the die pad 3 is exposed at the back surface 7b of the sealing body 7.

After the resin molding step is performed, each of the plurality of outer leads 4b exposed from the sealing body 7 is subjected to a plating process as necessary.

After the plating process, the cutting/forming step shown in FIG. 21 is performed. That is, the plurality of outer leads (outer portions) 4b and the suspension leads 5b which are exposed from the sealing body 7 are cut at predetermined positions to be detached from the frame portion 15 of the lead frame 14 shown in FIG. 20.

At approximately the same time as the cutting described above, as shown in FIG. 2, each of the plurality of outer leads 4b protruding from the sealing body 7 is formed into a gull-wing shape by bending (lead processing or lead forming).

In this manner, the SIP 9 shown in FIG. 1 is manufactured.

Effects of Present Embodiment

In the SIP 9 according to the present embodiment, with regard to the outside corner portions (first and second curved portions 3j and 3k) to which the suspension leads 5b of the die pad 3 are not connected, the radius of curvature of each of the first and second curved portion 3j and 3k is set larger than the radium of curvature of the third curved portion 3m. This can prevent delamination between the die pad 3 and the sealing resin of the sealing body 7.

By thus forming each of the outside corner portions of the die pad 3 to which the suspension leads 5 are not connected such that each of the curved portions has a large radius of curvature, when a stress is applied to the outside corner portion of the die pad 3 due to a temperature change or the like, it is possible to disperse the stress such that the stress is not concentrated and eliminate the starting point of the delamination of the die pad 3. As a result, it is possible to prevent the delamination of the die pad 3 of the resin which occurs at the outside corner portion.

This can improve the reliability of the SIP (semiconductor device) 9. This can also improve the quality of the SIP 9.

In the SIP 9 in the present embodiment, as shown in FIG. 10, the fourth curved portion 3n located at the inside corner portion of the die pad 3 shown as the portion F in FIG. 5 is also formed to have a radius of curvature larger than the radius of curvature of the third curved portion 3m (portion H). That is, the fourth curved portion 3n as the inside corner portion defined by the ninth and seventh sides 3i and 3g of the die pad 3 shown in FIG. 6 is formed to have the radius of curvature larger than the radius of curvature of the third curved portion 3m.

That is, when it is possible to prevent or inhibit the delamination of the die pad 3 at the first curved portion 3j (portion G in FIG. 10) and the second curved portion 3k (portion D in FIG. 10) thereof, a large stress is conceivably applied to the fourth curved portion 3n shown as the portion F in FIG. 10 in addition to the first and second curved portions 3j and 3k. Accordingly, by setting the radius of curvature of the fourth curved portion 3n defined by the ninth and seventh sides 3i and 3g of the die pad 3 shown in FIG. 6 larger than the radius of curvature of the third curved portion 3m, it is possible to disperse the stress even in the fourth curved portion 3n defined by the ninth and seventh sides 3i and 3g and eliminate the starting point of the delamination of the die pad 3. This can prevent the delamination at the fourth curved portion 3n.

As shown in FIG. 2, over the tip portion of each of the leads 4 closer to the die pad 3, the silver plating film 4c for coupling wires is formed. When the silver plating film 4c is formed over the tip portion of each of the leads 4, the silver plating film 4c may be deposited even over the side surface of the die pad 3. When the silver plating film 4c is deposited over the side surface of the die pad 3, delamination from the sealing resin of the sealing body 7 is likely to occur.

However, in the SIP 9 according to the present embodiment, even if the silver plating film 4c is deposited over the side surface of the die pad 3, it is possible to disperse the stress and eliminate the starting point of the delamination of the die pad 3. This is because each of the first, second, and fourth curved portions 3j, 3k, and 3n of the die pad 3 is formed to have a large radius of curvature. This can prevent the delamination at the first, second, and fourth curved portions 3j, 3k, and 3n.

The top surface of the die pad 3 subjected to a roughening process can increase the degree of adhesion between the die pad 3 and the sealing resin. As a result, it is possible to inhibit the delamination of the die pad 3 at the first, second, and fourth curved portion 3j, 3k, and 3n thereof.

In the SIP 9 in the present embodiment, the lower surface 3b of the die pad 3 is exposed from the back surface 7b of the sealing body 7. This can enhance heat dissipation from the die pad 3 and improve the heat dissipation property of the SIP 9.

In the SIP 9, the area of the upper surface 3a of the die pad 3 is larger than the sum (total) of the respective areas of the top surface 1a of the analog chip 1 and the top surface 2a of the microcomputer chip 2. That is, the SIP 9 has a large tab structure. Accordingly, it is possible to increase the heat capacity of the die pad 3 and enhance the heat dissipation property of the SIP 9.

When the lead pattern of the lead frame 14 is formed by an etching process, the outside and inside corner portions such as the first, second, third, and fourth curved portions 3j, 3k, 3m, and 3n can be formed in the same process step during the formation of the lead frame. That is, even when the die pad 3 is formed with the outside and inside corner portions which are not connected to the suspension leads 5, the process can be performed in the same process step during the formation of the lead frame.

<First Modification>

Figure 22:
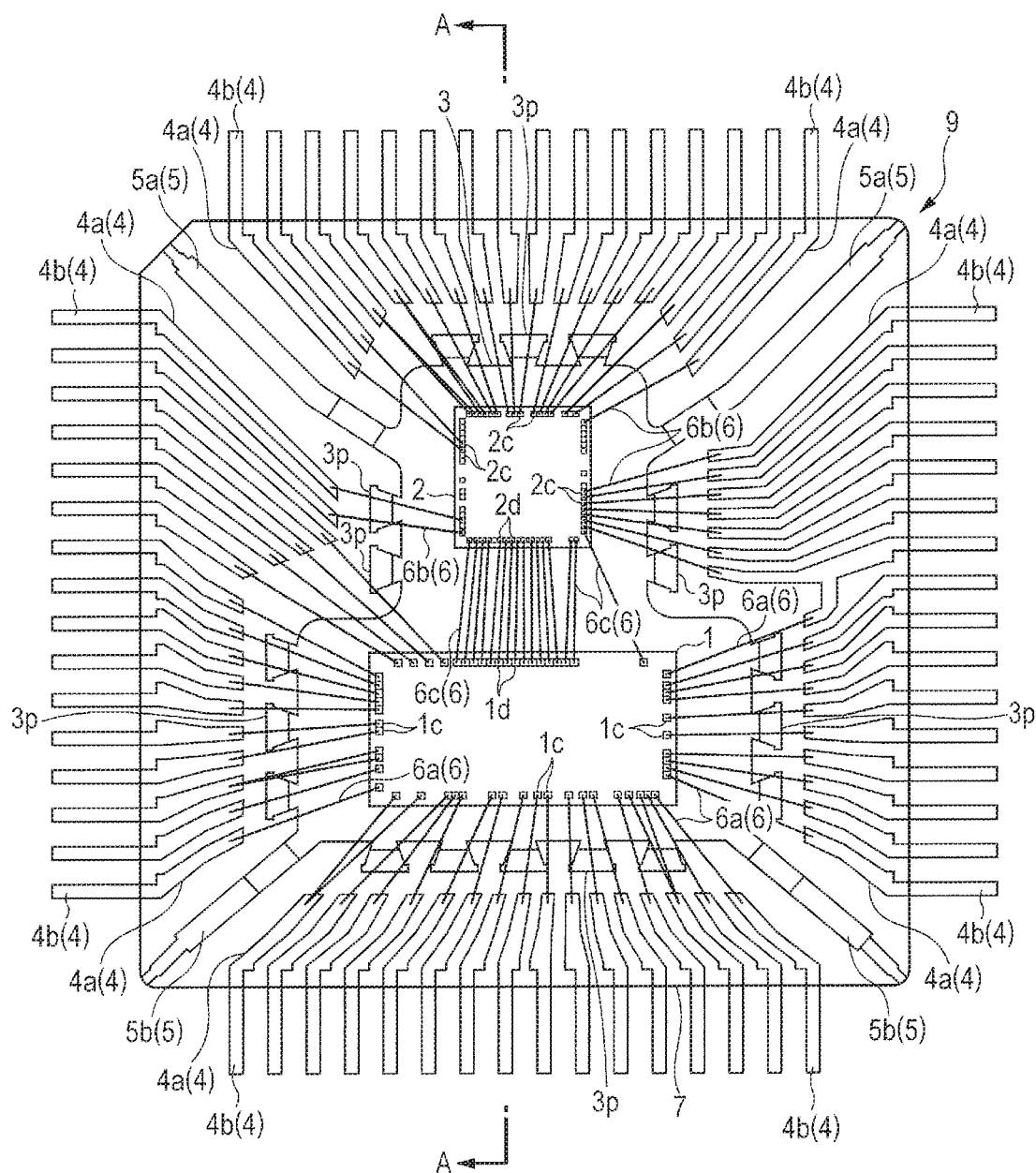
FIG. 22 is a plan view showing an inner structure of a semiconductor device in a first modification in a see-through state.
Figure 23:
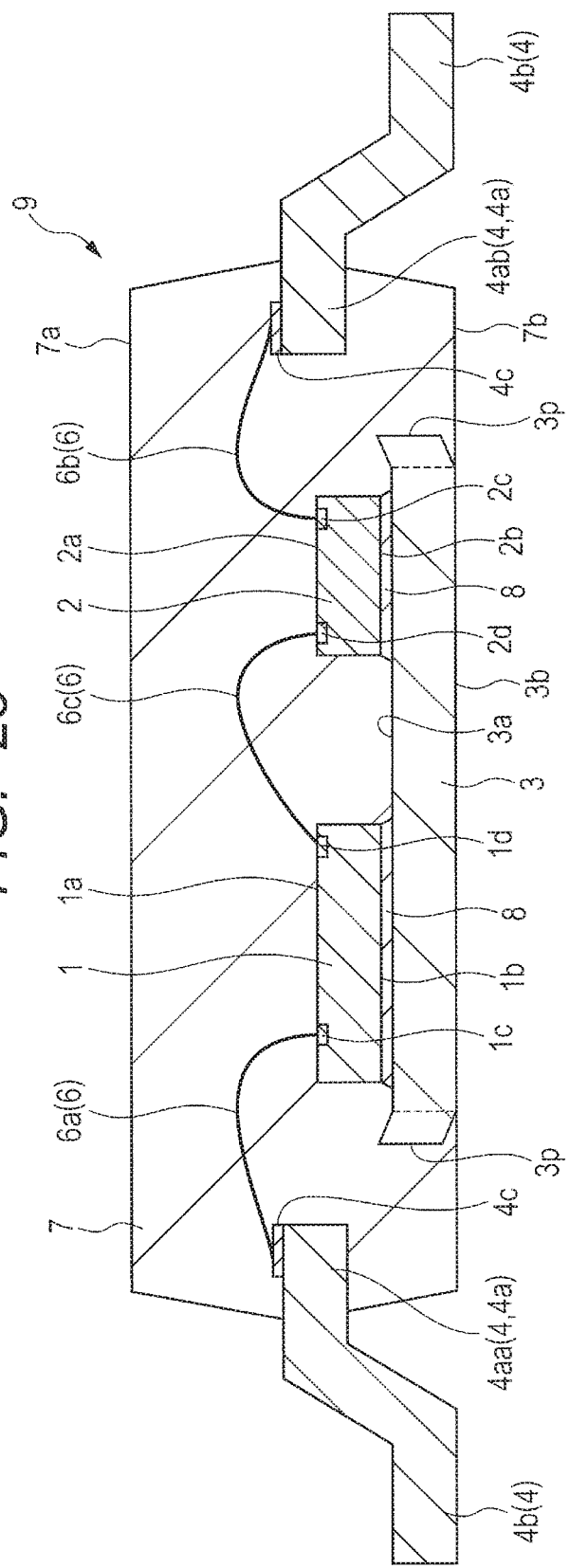
FIG. 23 is a cross-sectional view showing a structure resulting from cutting along the line A-A in FIG. 22.
Figure 24:
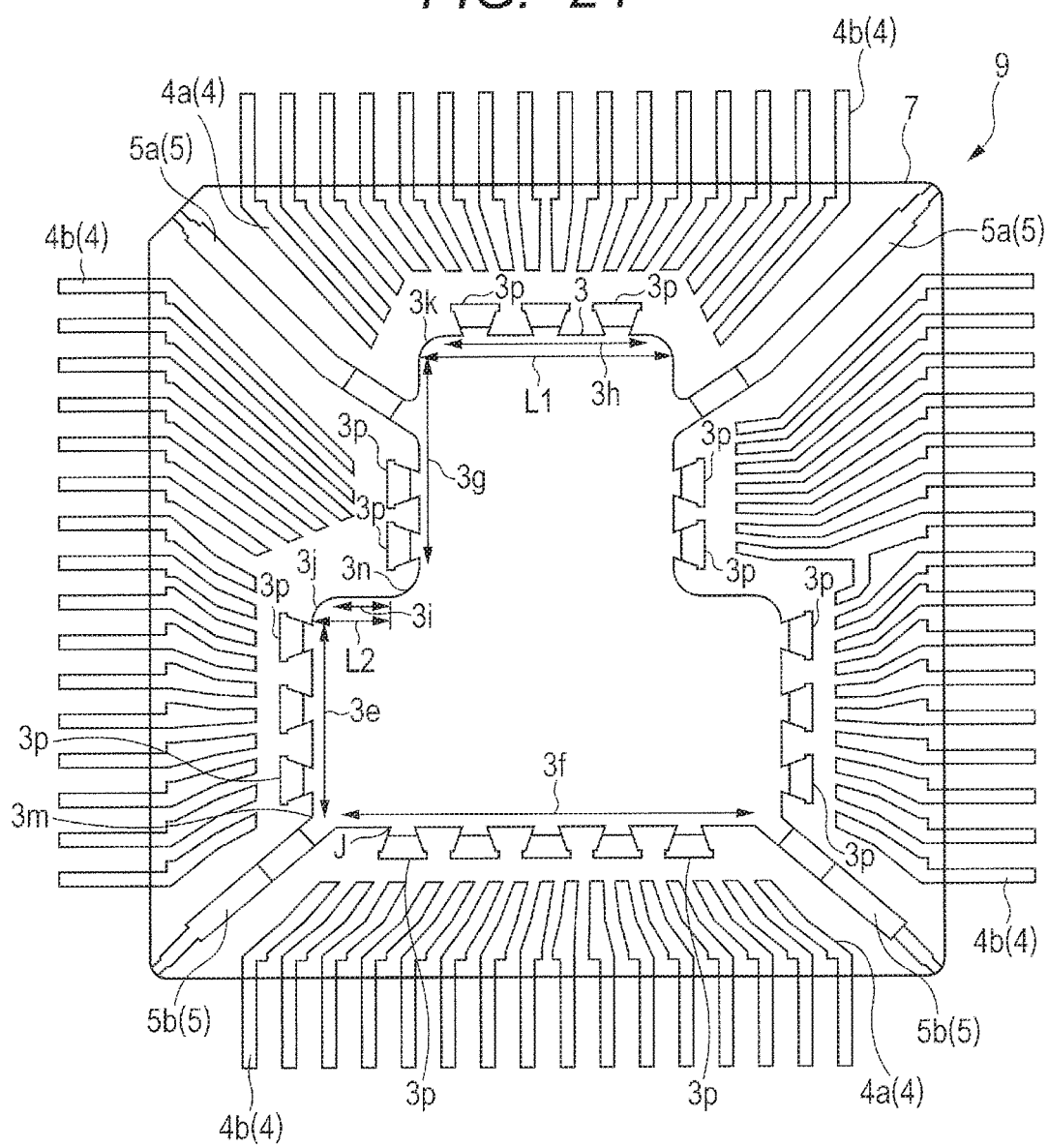
FIG. 24 is a plan view showing an inner structure of the semiconductor device in FIG. 22 in a see-through state.
Figure 25:
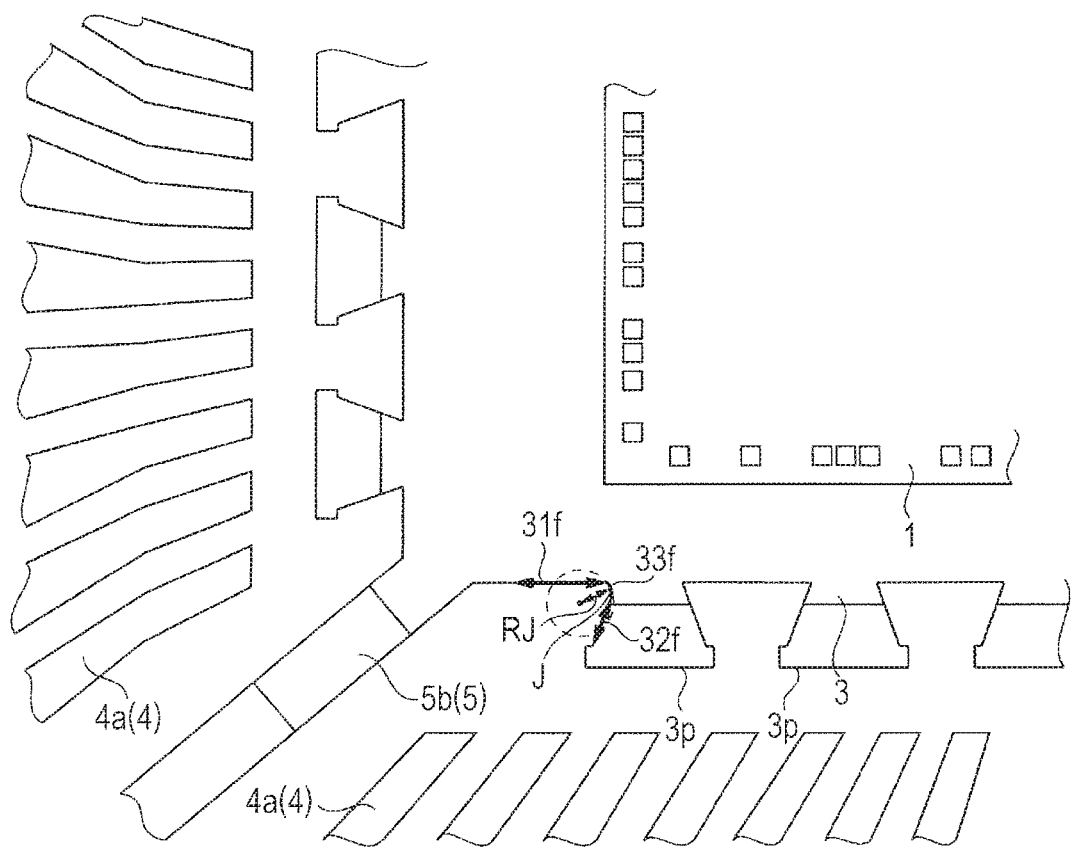
FIG. 25 is a partially enlarged plan view showing a structure of a curved portion as a portion J in FIG. 24.

FIG. 22 is a plan view showing an inner structure of a semiconductor device in a first modification in a see-through state. FIG. 23 is a cross-sectional view showing a structure resulting from cutting along the line A-A in FIG. 22. FIG. 24 is a plan view showing the inner structure of the semiconductor device in FIG. 22 in a see-through state. FIG. 25 is a partially enlarged plan view showing a structure of a curved portion as a portion J in FIG. 24.

When the SIP 9 in the first modification shown in FIG. 22 is shown in plan view in FIG. 24, a plurality of protruding portions 3p are formed on each of the side surfaces of the die pad 3 which correspond to the fifth, sixth, seventh, and eighth sides 3e, 3f, 3g, and 3h thereof. As shown in FIG. 23, each of the plurality of protruding portions 3p is bent toward the semiconductor chips. That is, each of the protruding portions 3p is bent upward (in a direction toward the top surface 7a of the sealing body 7).

Since each of the plurality of protruding portions 3p formed so as to protrude from the die pad 3 is bent upward, it is possible to reduce the stress applied to the adhesive material 8 due to a temperature change or the like and inhibit the delamination of the adhesive material 8. Note that the process of bending the plurality of protruding portions 3p in an upward direction (toward the semiconductor chips) can simultaneously be performed in the same step as the process of offsetting the die pad 3 (tab lowering process). Thus, the process of bending the plurality of protruding portions 3p can be performed without increasing the number of process steps.

Note that, as shown in FIG. 25, each of the protruding portions 3p of the die pad 3 has a curved portion 33f (portion J) in the base portion thereof in plan view. The curved portion 33f (portion J) is located between a side 31f extending along the sixth side 3f of the die pad 3 in FIG. 24 and a side 32f of the protruding portion 3p extending generally along the lead 5b and connected to the side 31f of the die pad 3 and to the side 32*f* of the protruding portion 3*p*. Examples of the radius of curvature of the curved portion 33*f* include RJ=0.125 mm (Max).

Accordingly, each of the first, second, and fourth curved portions 3*j*, 3*k*, and 3*n* of the die pad 3 is formed to have a radius of curvature larger than the radius of curvature of the curved portion (portion J) in the base portion of the protruding portion 3*p*. This can disperse the stress and eliminate the starting point of the delamination of the die pad 3. As a result, it is possible to prevent the delamination of the die pad 3.

Note that, of the die pad 3, the portion corresponding to the ninth side 3*i* has a length (L2) shorter than a length (L1) of the portion thereof corresponding to the eighth side 3*h* (L2<L1). Accordingly, in the SIP 9, the protruding portions 3*p* are not formed on the side surface of the die pad 3 which corresponds to the ninth side 3*i*. However, when the ninth side 3*i* is sufficiently long to allow the protruding portions 3*p* to be formed thereon, the protruding portions 3*p* may also be formed over the side surface corresponding to the ninth side 3*i*.

<Second Modification>

Figure 26:
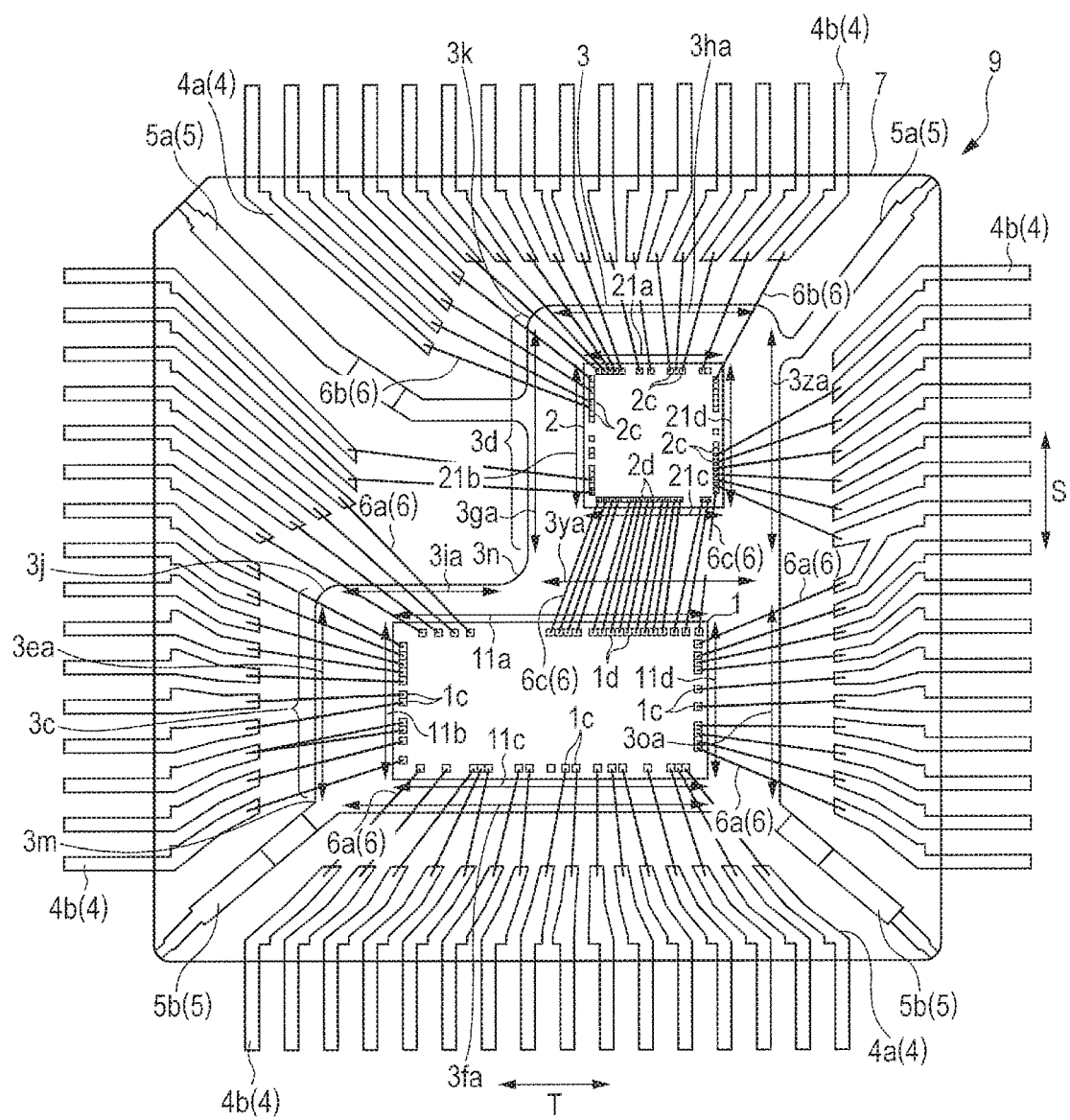
FIG. 26 is a plan view showing an inner structure of a semiconductor device in a second modification in a see-through state.

FIG. 26 is a plan view showing the inner structure of a semiconductor device in a second modification in a see-through state.

The SIP 9 in the second modification is a semiconductor device having a structure in which, in plan view, the microcomputer chip 2 is disposed at a position out of alignment with the analog chip 1. That is, in the SIP 9 shown in FIG. 1, both of the analog chip 1 and the microcomputer chip 2 are disposed such that the respective centers thereof are generally aligned with the center of the sealing body 7. By contrast, in the SIP 9 in FIG. 26, the microcomputer chip 2 is disposed to be displaced from and out of alignment with the center of the sealing body 7.

Specifically, the top surface 1*a* of the analog chip 1 has a quadrilateral shape in plan view and has the side 11*b* provided along the first direction S, the side 11*d* provided along the first direction S and located opposite to the side 11*b*, the side 11*a* provided along the second direction T, and the side 11*c* provided along the second direction T and located opposite to the side 11*a*.

On the other hand, the top surface 2*a* of the microcomputer chip 2 has a quadrilateral shape in plan view and has the side 21*b* provided along the first direction S, the side 21*d* provided along the first direction S and located opposite to the side 21*b*, the side 21*a* provided along the second direction T, and the side 21*c* provided along the second direction T and located opposite to the side 21*a*.

The die pad 3 includes the first portion 3*c* and the second portion 3*d*. The first portion 3*c* in FIG. 26 corresponds to the portion (region or area) enclosed in plan view by a sixth side 3*fa* extending along the second direction T, a ninth side 3*ia* located opposite to the sixth side 3*fa*, a virtual line 3*ya* (virtual line 3*ya* located on the extension line of the ninth side 3*ia* in the second direction T) connected to the ninth side 3*ia* in the second direction T, a fifth side 3*ea* extending along the first direction S, and a side 3*oa* (having a length in the first direction S equal to that of the fifth side 3*ea*) located opposite to the fifth side 3*ea*. The second portion 3*d* corresponds to the portion (region or area) enclosed in plan view by an eighth side 3*ha* extending along the second direction T, the virtual line 3*ya* (having a length in the second direction T equal to that of the eighth side 3*ha*) located opposite to the eighth side 3*ha*, a seventh side 3*ga* extending along the first direction S, and a side 3*za* (having a length in the first direction S equal to that of the seventh side 3*ga*) located opposite to the seventh side 3*ga*.

In plan view, the second portion 3*d* is disposed out of alignment with the first portion 3*c*. The first and second portions 3*c* and 3*d* are arranged such that the side 3*oa* of the first portion 3*c* and the side 3*za* of the second portion 3*d* are connected in the form of a straight line.

Accordingly, when attention is focused on the positional relationship between the chips, the chips are disposed such that the center of the microcomputer chip 2 mounted over the second portion 3*d* is displaced from the center of the analog chip 1 mounted over the first portion 3*c* in plan view.

Even when the microcomputer chip 2 is disposed to be displaced from the center of the sealing body 7 in plan view, by forming the first, second, and fourth curved portions 3*j*, 3*k*, and 3*n* of the die pad 3 such that the radius of curvature of each of the first, second, and fourth curved portions 3*j*, 3*k*, and 3*n* is larger than the radius of curvature of the third curved portion 3*m*, it is possible to disperse the stress and eliminate the starting point of the delamination of the die pad 3. This can prevent the delamination of the die pad 3.

As a result, the SIP 9 in the present embodiment can be adapted either to the structure shown in FIG. 1 or to the structure shown in FIG. 26 to allow the same effects to be obtained. Therefore, it is possible to implement a semiconductor device which is highly flexible with regard to pad arrangement over the semiconductor chips and the routing of the inner leads 4*a*.

<Third Modification>

Figure 27:
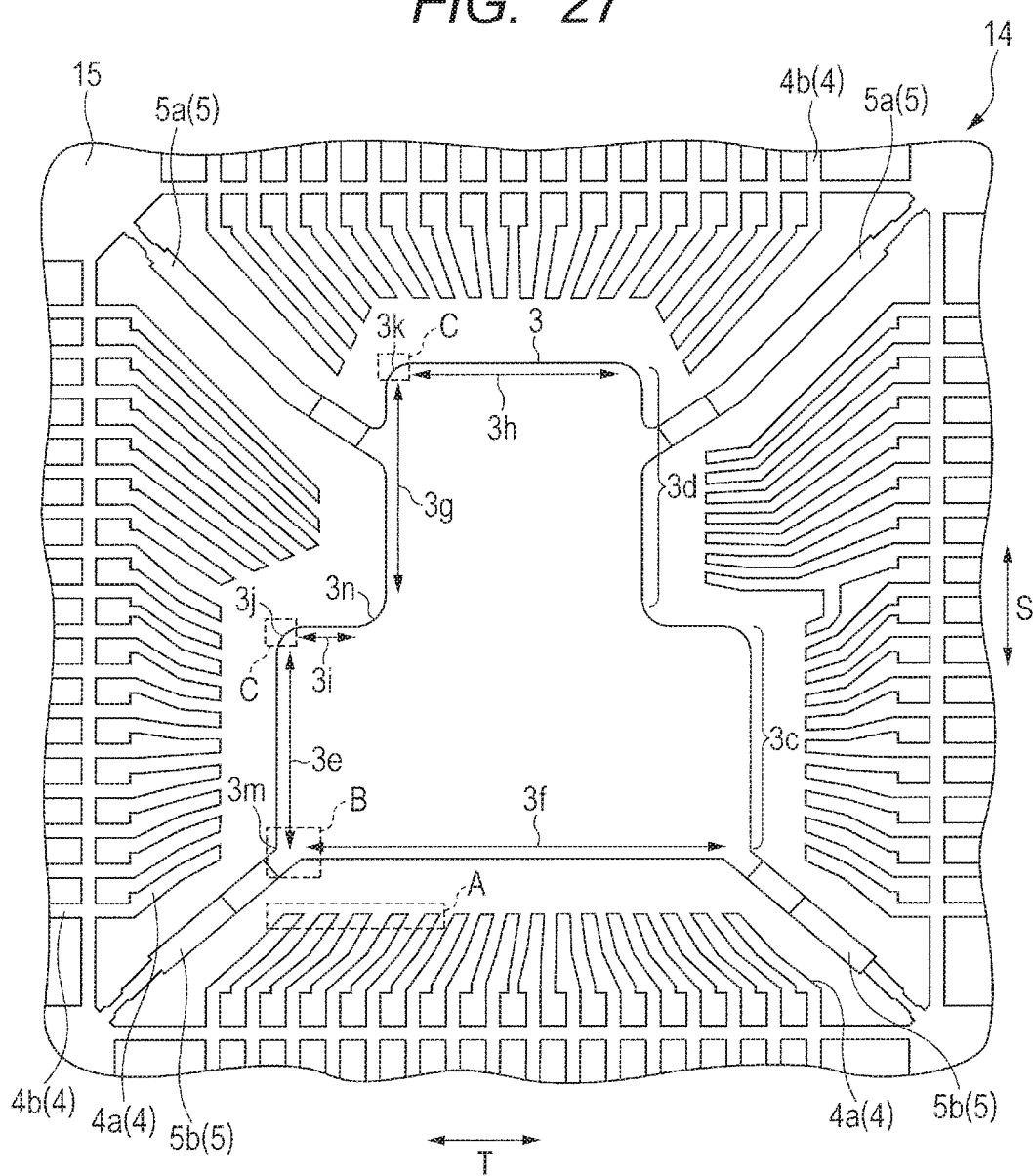
FIG. 27 is a partial plan view showing a structure of a lead frame in a third modification.
Figure 38:
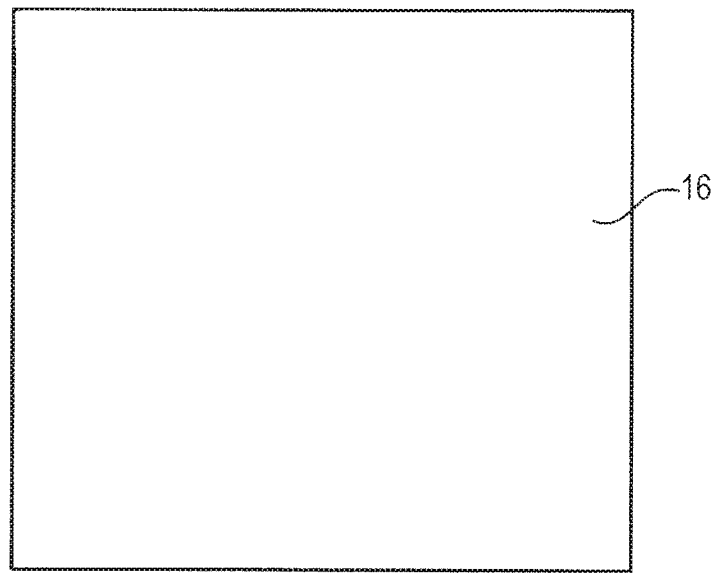
FIG. 38 is a partially enlarged view showing an example of the press working procedure in a portion C in FIG. 27.
Figure 39:
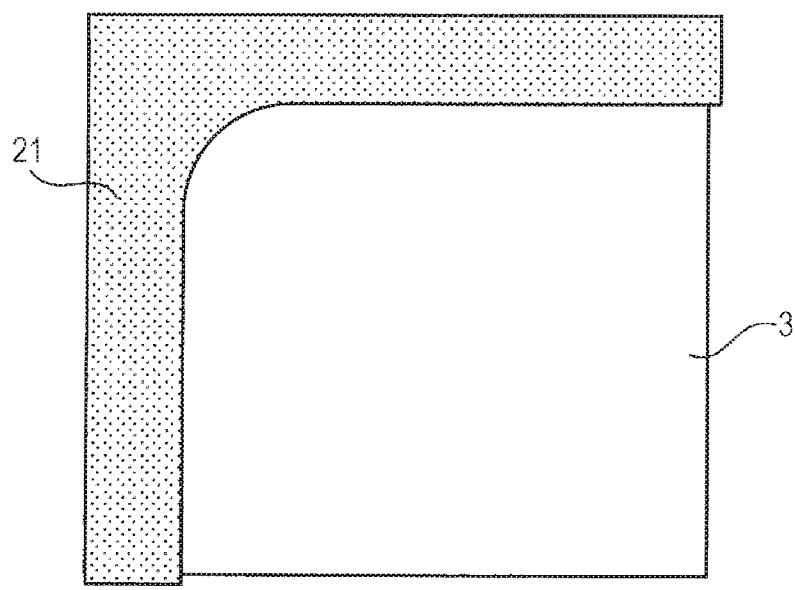
FIG. 39 is a partially enlarged view showing the example of the press working procedure in the portion C in FIG. 27.
Figure 40:
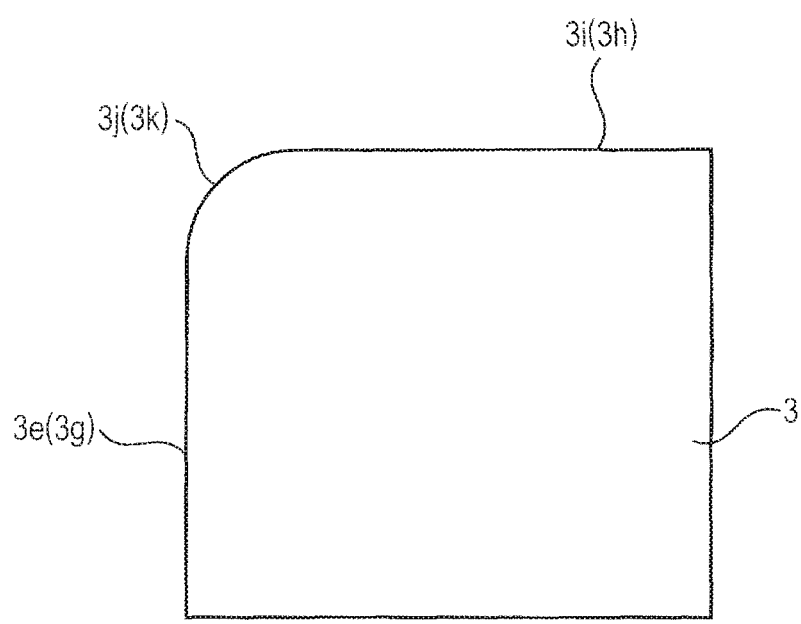
FIG. 40 is a partially enlarged view showing the example of the press working procedure in the portion C in FIG. 27.

FIG. 27 is a partial plan view showing a structure of a lead frame according to a third modification. FIGS. 28 to 32 are partially enlarged views each showing an example of a press working procedure in the portion A in FIG. 27. FIGS. 33 to 37 are partially enlarged views each showing an example of the press working procedure in the portion B in FIG. 27. FIGS. 38 to 40 are partially enlarged views each showing an example of the press working procedure in the portion C in FIG. 27.

In the third modification, a description will be given of a processing method for the respective tip portions of the plurality of leads 4, the third curved portion 3*m* like an inside corner portion, and the first and second curved portions 3*j* and 3*k* as the outside corner portions when the lead frame 14 is processed by press working.

Figure 28:
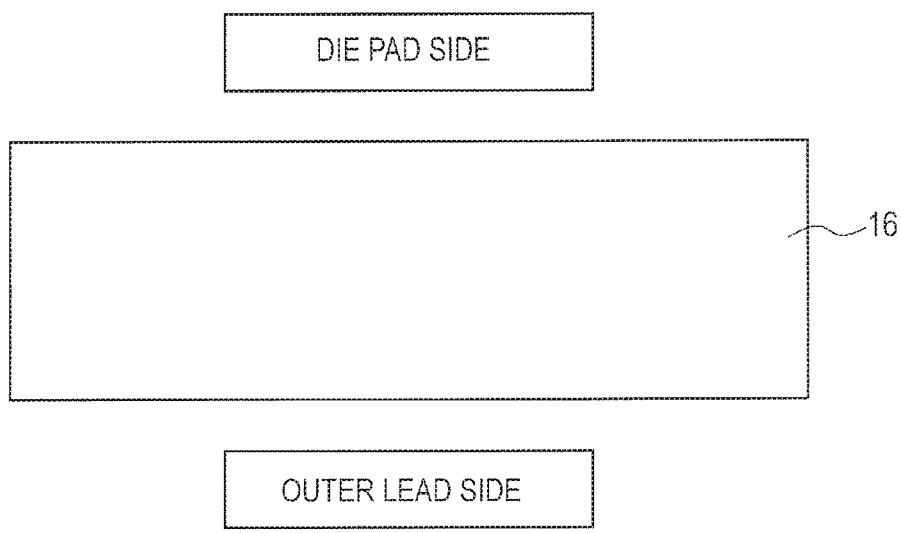
FIG. 28 is a partially enlarged view showing an example of a press working procedure in a portion A in FIG. 27.
Figure 29:
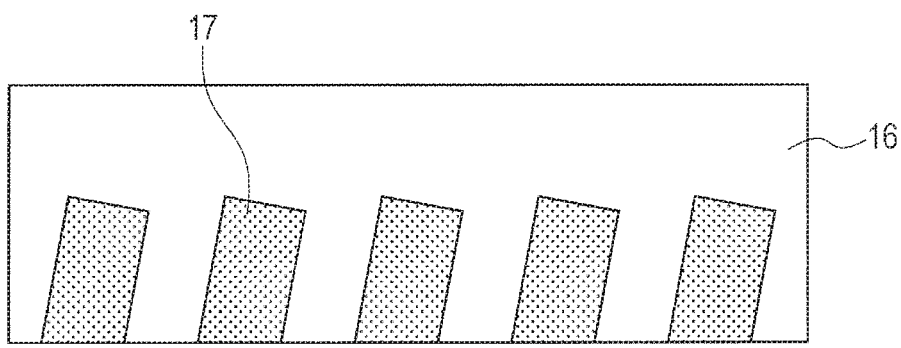
FIG. 29 is a partially enlarged view showing the example of the press working procedure in the portion A in FIG. 27.
Figure 30:
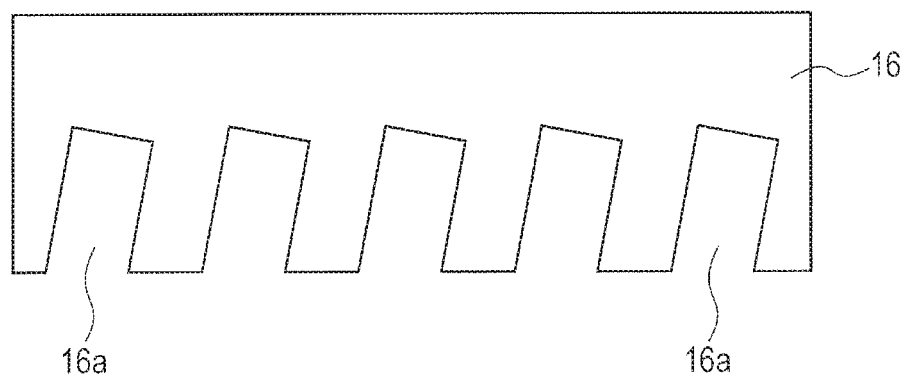
FIG. 30 is a partially enlarged view showing the example of the press working procedure in the portion A in FIG. 27.

In the processing for the respective tip portions of the plurality of leads 4 (inner leads 4*a*) shown in the portion A in FIG. 27 which are closer to the die pad 3, first, a frame base material 16 shown in FIG. 28 is provided. Next, as shown in FIG. 29, using a first die 17, incisions (spaces) 16*a* shown in FIG. 30 are made in the frame base material 16 so as to provide the plurality of separate individual inner leads 4*a* shown in FIG. 27. In other words, the adjacent leads are cut apart using the first die 17 such that the incisions (spaces) are made between the adjacent leads.

Figure 31:
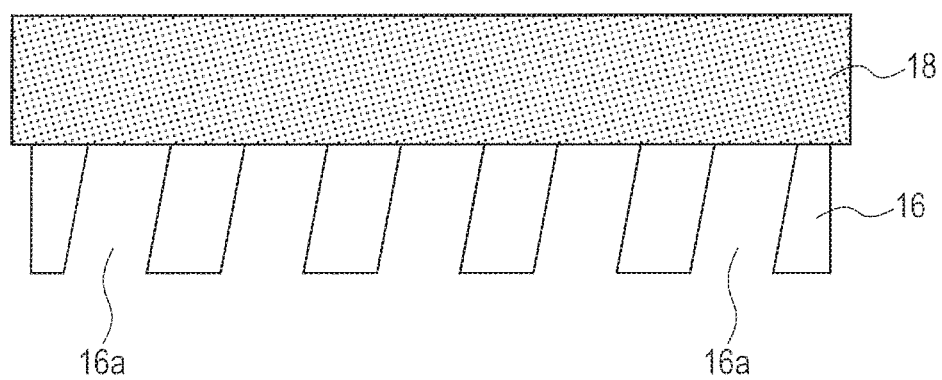
FIG. 31 is a partially enlarged view showing the example of the press working procedure in the portion A in FIG. 27.
Figure 32:
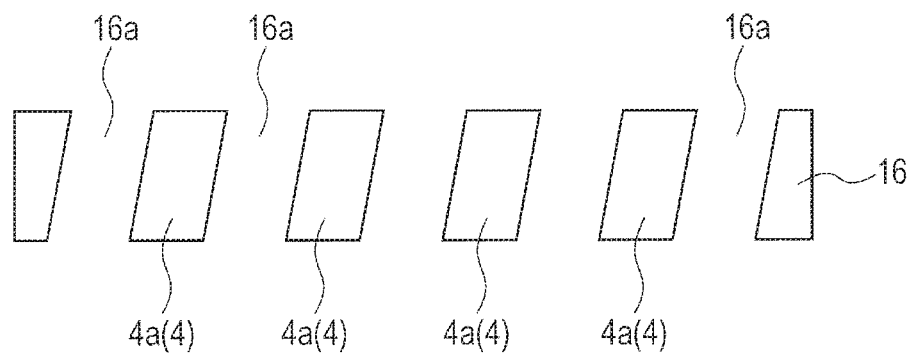
FIG. 32 is a partially enlarged view showing the example of the press working procedure in the portion A in FIG. 27.

Next, as shown in FIG. 31, using a second die 18, the respective tip portions of the plurality of leads 4 shown in FIG. 27 which are closer to the die pad 3 are simultaneously cut to form the plurality of inner leads 4*a* shown in FIG. 32. That is, after the incisions 16*a* for the individual leads are formed, as shown in FIG. 31, the respective tip portions of the plurality of leads 4 are simultaneously cut using the second die 18 to form the inner leads (inner portions) 4*a* of the plurality of leads 4 shown in FIG. 32.

Figure 33:
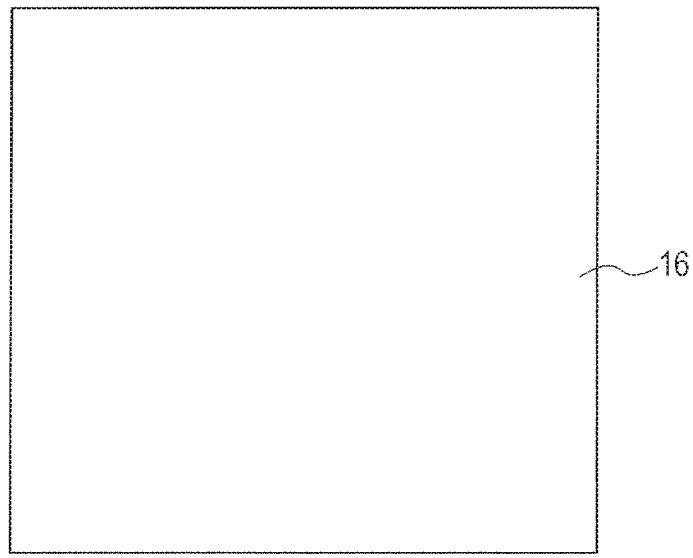
FIG. 33 is a partially enlarged view showing an example of the press working procedure in a portion B in FIG. 27.
Figure 34:
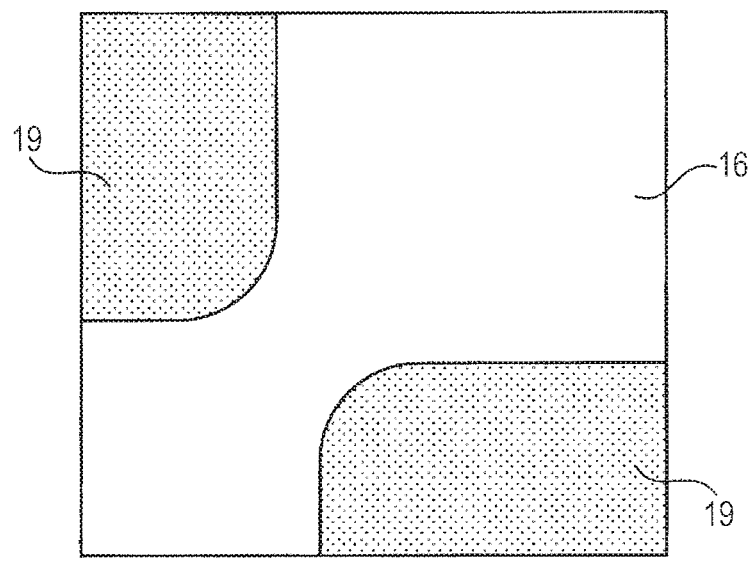
FIG. 34 is a partially enlarged view showing the example of the press working procedure in the portion B in FIG. 27.

In the processing for the third curved portion 3*m* shown in the portion B in FIG. 27, first, the frame base material 16 shown in FIG. 33 is provided. Next, as shown in FIG. 34, using a third die 19, forming for the die pad 3 shown in FIG.

Figure 35:
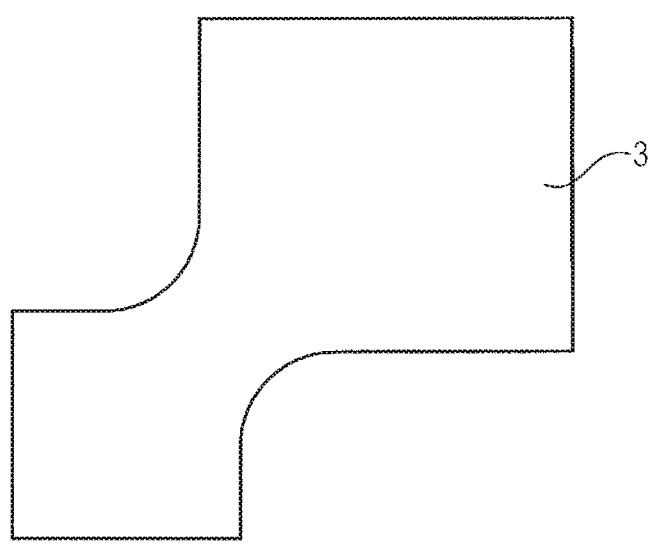
FIG. 35 is a partially enlarged view showing the example of the press working procedure in the portion B in FIG. 27.

27 is performed. Here, using the third die 19, the portion of the frame base material 16 which corresponds to the third curved portion 3m is partially cut as shown in FIG. 35 to form the portion of the third curved portion 3m which is connected to the die pad 3 shown in FIG. 27.

Figure 36:
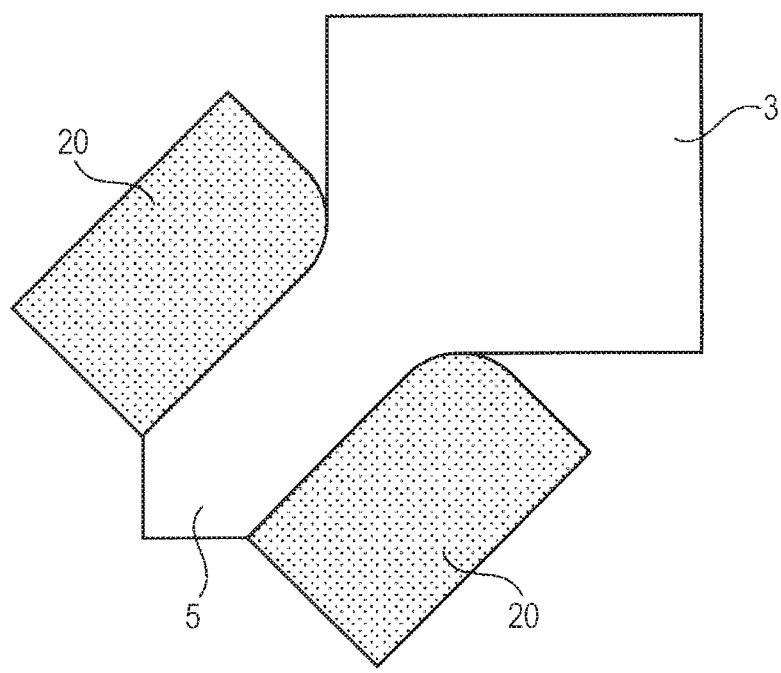
FIG. 36 is a partially enlarged view showing the example of the press working procedure in the portion B in FIG. 27.
Figure 37:
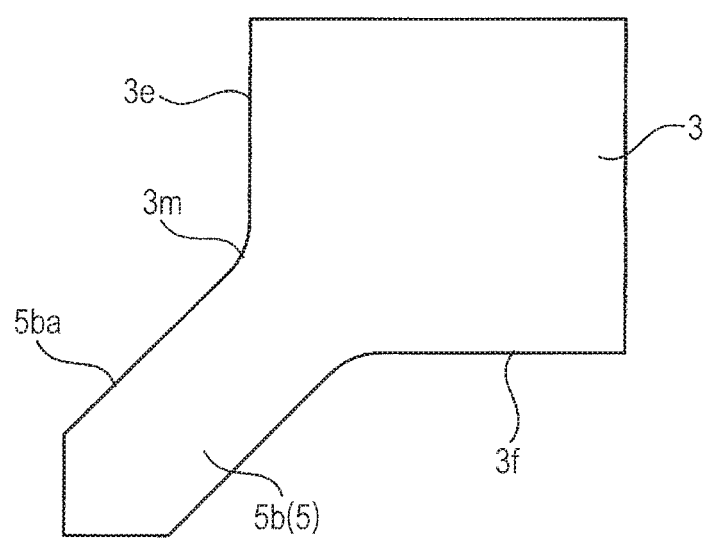
FIG. 37 is a partially enlarged view showing the example of the press working procedure in the portion B in FIG. 27.

Next, as shown in FIG. 36, the suspension lead 5 is subjected to forming using a fourth die 20 to form the third curved portion 3m shown in FIG. 37 and also form the suspension lead 5 (suspension lead 5b). That is, using the fourth die 20, the portion of the curved portion 3m which is connected to the suspension leads 5 is partially cut to form the suspension lead 5 (suspension lead 5b) and the third curved portion 3m, as shown in FIG. 37.

Thus, the processing for the respective tip portions of the plurality of leads (inner leads 4a) shown in the portion A in FIG. 27 and the processing for the third curved portion 3m connected to the suspension lead 5 shown in the portion B in FIG. 27 can be performed by the two cutting steps. Consequently, an untended curve shape (natural R-shape) is likely to be formed.

On the other hand, in the processing for the first curved portion 3j shown in the portion C in FIG. 27 (the same is true for the processing for the second curved portion 3k), first, the frame base material 16 shown in FIG. 38 is provided. Next, using a fifth die 21 shown in FIG. 39, correspondingly to the first curved portion 3j shown in FIG. 27, the first curved portion 3j shown in FIG. 40 is formed by one cutting step.

Note that, as described above, the first curved portion 3j of the die pad 3 is formed by the one cutting step. Accordingly, unless a curved portion (portion R) is intentionally formed in the fifth die 21, an intended curved portion (portion R) having a small radius of curvature as shown in the portion A or B in FIG. 27 is formed or a curved portion (portion R) is not formed at all.

That is, in the SIP 9 according to the present embodiment, each of the first, second, and fourth curved portions 3j, 3k, and 3n of the die pad 3 is intentionally formed to have a large radius of curvature.

<Fourth Modification>

Figure 41:
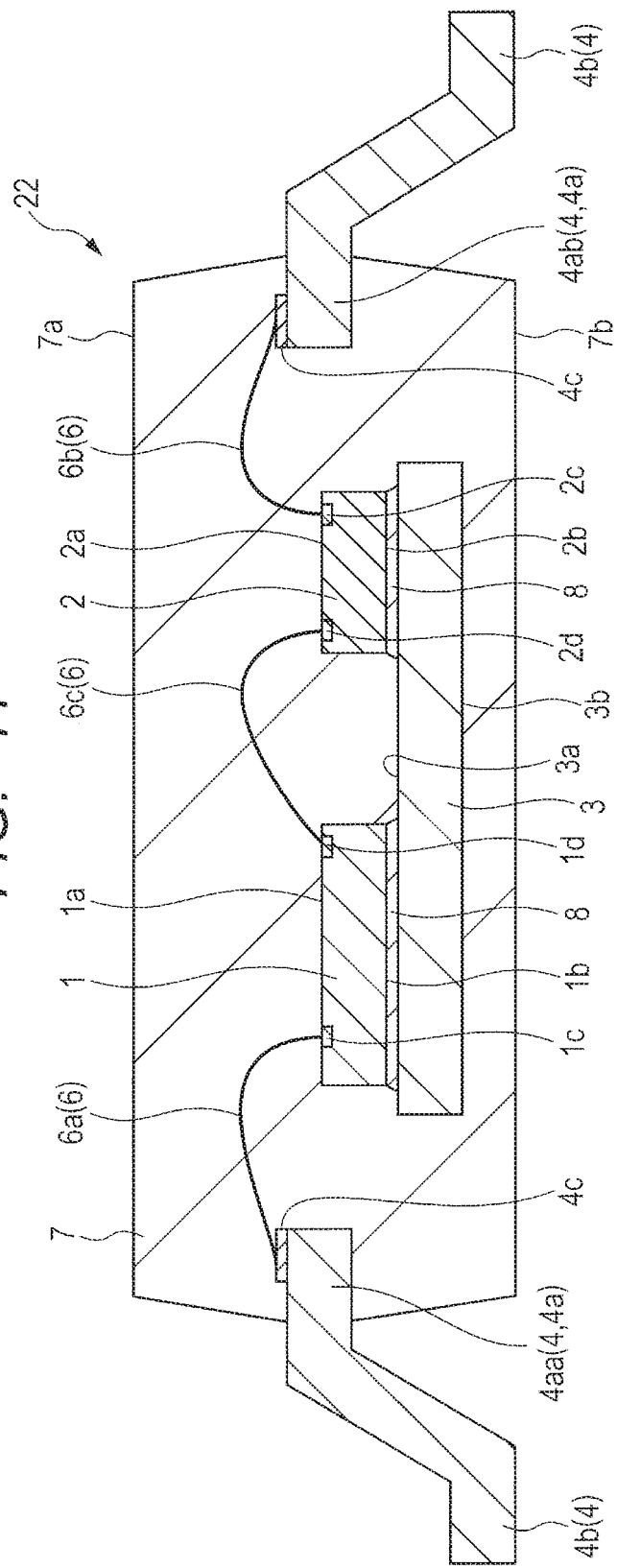
FIG. 41 is a cross-sectional view showing a structure of a semiconductor device in a fourth modification.

FIG. 41 is a cross-sectional view showing a structure of a semiconductor device in a fourth modification.

A SIP 22 shown in FIG. 41 is a QFP-type semiconductor device similar to the SIP 9 shown in FIG. 1 and includes the die pad 3 having an outside corner portion of the same shape as that in the SIP 9 shown in FIG. 1. That is, as shown in FIG. 5, each of the first, second, and fourth curved portions 3j, 3k, and 3n of the die pad 3 is formed to have a radius of curvature larger than the radius of curvature of the third curved portion 3m.

The structure of the SIP 22 in FIG. 41 is different from that of the SIP 9 in FIG. 1 in that the lower surface 3b of the die pad 3 is not exposed at the back surface 7b of the sealing body 7, but is covered with a sealing resin.

That is, the SIP 22 in FIG. 41 is a semiconductor device having the structure in which the die pad 3 is embedded in the sealing body 7. However, the structure of the SIP 22 in FIG. 41 is otherwise the same as that of the SIP 9 in FIG. 1. Accordingly, in the SIP 22 having the structure in which the die pad 3 is embedded in the sealing body 7 also, in the same manner as in the SIP 9 in FIG. 1, each of the first, second, and fourth curved portions 3j, 3k, and 3n of the die pad 3 shown in FIG. 5 is formed to have a radius of curvature larger than the radius of curvature of the third curved portion 3m. Thus, the stress is dispersed in the outside corner portion of the die pad 3 to which the suspension lead 5 is not connected so as not to be concentrated thereon. As a result, it is possible to eliminate the starting point of the delamination of the die pad 3.

This can prevent the delamination of the die pad 3 from the resin which occurs at the outside corner portion and consequently allows an improvement in the reliability of the SIP (semiconductor device) 22.

<Fifth Modification>

Figure 42:
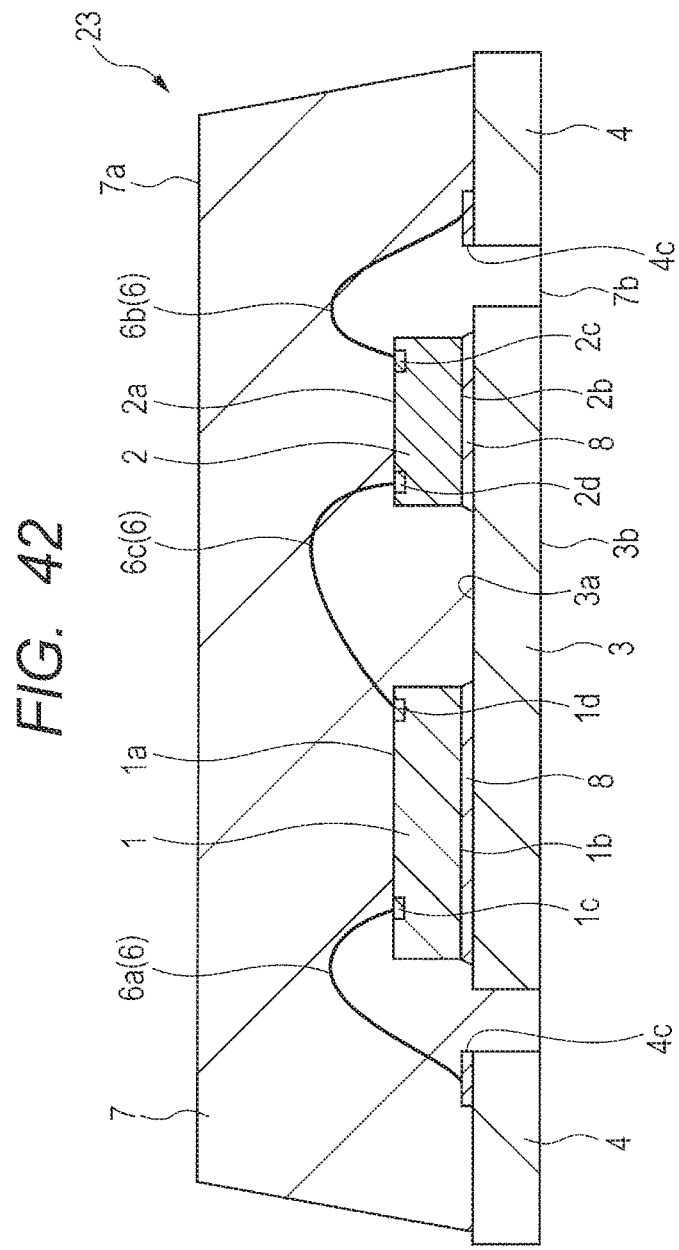
FIG. 42 is a cross-sectional view showing a structure of a semiconductor device in a fifth modification.

FIG. 42 is a cross-sectional view showing a structure of a semiconductor device in a fifth modification.

The semiconductor device shown in FIG. 42 is a QFN (Quad Flat Non-leaded Package) 23. That is, the semiconductor device shown in FIG. 42 is of a type in which the plurality of individual leads 4 are exposed at the back surface 7b of the sealing body 7. The structure of the QFN 23 shown in FIG. 42 or the like is otherwise the same as that of the SIP 9 shown in FIG. 1 in terms of the shape of the die pad 3 in the QFN 23.

Accordingly, in the QFN 23 shown in FIG. 42 also, in the same manner as in the SIP 9 in FIG. 1, each of the first, second, and fourth curved portions 3j, 3k, and 3n of the die pad 3 shown in FIG. 5 is formed to have a radius of curvature larger than the radius of curvature of the third curved portion 3m. Therefore, it is possible to disperse the stress in the outside corner portion of the die pad 3 to which the suspension lead 5 is not connected so as to prevent the stress from being concentrated thereon and eliminate the starting point of the delamination of the die pad 3.

This can prevent the delamination of the die pad 3 from the resin which occurs at the outside corner portion and consequently improve the reliability of the QFN (semiconductor device) 23.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

In the foregoing embodiment and modifications, the case where the semiconductor device is a QFP (Quad Flat Package) type or a QFN is described by way of example. However, the foregoing semiconductor device is not limited to the QFP type or the QFN. Another semiconductor device may also be used as long as the outside and inside corner portions of the die pad 3 have shapes similar to those shown in FIGS. 1 and 5 in plan view.

The modifications can be, e.g., combined to be used appropriately within the scope not departing from the gist of the technical idea described in the foregoing embodiment.

What is claimed is:

1. A semiconductor device, comprising:
   a first semiconductor chip having a first main surface over which a plurality of first electrodes and a plurality of second electrodes are formed;
   a second semiconductor chip having a second main surface over which a plurality of third electrodes and a plurality of fourth electrodes are formed;
   a chip mounting portion having a third main surface over which the first and second semiconductor chips are mounted;
   a plurality of leads arranged so as to surround the chip mounting portion;
   a plurality of suspension leads formed integrally with the chip mounting portion;

a plurality of first conductive members electrically connecting the plurality of first electrodes with a plurality of first leads which are included in the plurality of leads;

a plurality of second conductive members electrically connecting the third electrodes with a plurality of second leads which are included in the plurality of leads; and a sealing body sealing the first semiconductor chip, the second semiconductor chip, a portion of the chip mounting portion, a portion of each of the plurality of leads, the plurality of first conductive members, and the plurality of second conductive members, wherein, in plan view, a size of the first main surface of the first semiconductor chip is larger than a size of the second main surface of the second semiconductor chip, wherein, in plan view, the first semiconductor chip has a first side extending in a first direction, and a second side extending in a second direction crossing the first direction, wherein, in plan view, the second semiconductor chip has a third side extending in the first direction and a fourth side extending in the second direction, wherein, in plan view, the first side of the first semiconductor chip and the third side of the second semiconductor chip are located between the second side of the first semiconductor chip and the fourth side of the second semiconductor chip, wherein, in plan view, the chip mounting portion has a fifth side extending along and adjacent to the first side, a sixth side extending along and adjacent to the second side, a seventh side extending along and adjacent to the third side, an eighth side extending along and adjacent to the fourth side, and a ninth side located between the fifth and seventh sides and extending along the second direction, wherein, in plan view, the chip mounting portion has a first curved portion continued to each of the fifth and ninth sides and a second curved portion continued to each of the seventh and eighth sides, wherein, in plan view, the sealing body has a plurality of outside corner portions, wherein a first suspension lead which is included in the plurality of suspension leads extends from the seventh side toward a first outside corner portion which is among the plurality of outside corner portions of the sealing body, the first outside corner portion being located closest to the seventh side among the plurality of outside corner portions, wherein a second suspension lead which is included in the plurality of suspension leads extends from a corner portion defined by the fifth and sixth sides toward a second outside corner portion which is among in the plurality of outside corner portions of the sealing body, wherein, in plan view, the second suspension lead has a tenth side extending from the chip mounting portion toward the second outside corner portion, wherein, in plan view, the chip mounting portion has a third curved portion continued to each of the tenth and fifth sides, wherein each of the first and second curved portions has a radius of curvature larger than a radius of curvature of the third curved portion, wherein the third main surface of the chip mounting portion has:
  a first portion over which the first semiconductor chip is mounted and having the fifth side and the sixth side; and
  a second portion over which the second semiconductor chip is mounted and having the seventh side and the eighth side, wherein, in plan view, a size of the third main surface in the second portion is smaller than a size of the third main surface in the first portion, and wherein a length of the eighth side is shorter than a length of the sixth side.

2. The semiconductor device according to claim 1, wherein the chip mounting portion has a back surface opposite to the third main surface and exposed from the sealing body.

3. The semiconductor device according to claim 1, wherein
the plurality of second electrodes of the first semiconductor chip is electrically connected with the fourth electrodes of the second semiconductor chip via a plurality of third conductive members.

4. The semiconductor device according to claim 1, wherein each of the plurality of leads has an end portion extending toward the chip mounting portion, and
wherein a silver plating film is formed over the end portion.

5. The semiconductor device according to claim 1, wherein, in plan view, a plurality of protruding portions is formed on each of side surfaces of the chip mounting portion which respectively correspond to the fifth, sixth, seventh, and eighth sides thereof, and
wherein each of the protruding portions is bent toward the first and second semiconductor chips.

6. The semiconductor device according to claim 1, wherein each of the plurality of leads, the plurality of suspension leads, and the chip mounting portion contains copper as a main component, and
wherein the third main surface of the chip mounting portion has a planarity lower than a planarity of a first back surface of the first semiconductor chip which is opposite to the first main surface thereof.

7. The semiconductor device according to claim 1, wherein the plurality of leads disposed in a region between the first and second suspension leads includes a lead having a respective tip portion located on one side of the fifth side of the chip mounting portion in the second direction in plan view and a lead having a respective tip portion located on a side opposite to the one side of the fifth side of the chip mounting portion in the second direction in plan view.

8. The semiconductor device according to claim 1, wherein an area of the third main surface of the chip mounting portion is larger than a sum of an area of the first main surface of the first semiconductor chip and an area of the second main surface of the second semiconductor chip.

* * * * *